US010147761B2

(12) United States Patent
Yoshikawa et al.

(10) Patent No.: US 10,147,761 B2
(45) Date of Patent: Dec. 4, 2018

(54) SEMICONDUCTOR MEMORY DEVICE WITH MAGNETORESISTIVE ELEMENT

(71) Applicant: TOSHIBA MEMORY CORPORATION, Minato-ku, Tokyo (JP)

(72) Inventors: Masatoshi Yoshikawa, Seoul (KR); Shuichi Tsubata, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 92 days.

(21) Appl. No.: 15/457,556

(22) Filed: Mar. 13, 2017

(65) Prior Publication Data

US 2018/0076261 A1    Mar. 15, 2018

Related U.S. Application Data

(60) Provisional application No. 62/394,151, filed on Sep. 13, 2016.

(51) Int. Cl.
*H01L 27/22*    (2006.01)
*H01L 43/08*    (2006.01)
*H01L 43/12*    (2006.01)

(52) U.S. Cl.
CPC ............ *H01L 27/222* (2013.01); *H01L 43/08* (2013.01); *H01L 43/12* (2013.01)

(58) Field of Classification Search
CPC ....... H01L 27/222; H01L 43/02; H01L 43/08; H01L 43/10
See application file for complete search history.

(56) References Cited

U.S. PATENT DOCUMENTS

| 2012/0074511 A1 | 3/2012 | Takahashi et al. |
| 2013/0069182 A1 | 3/2013 | Ohsawa et al. |
| 2013/0248355 A1 | 9/2013 | Ohsawa et al. |
| 2015/0069558 A1* | 3/2015 | Nakayama ............. H01L 43/02 257/421 |

* cited by examiner

*Primary Examiner* — Ratisha Mehta
(74) *Attorney, Agent, or Firm* — Holtz, Holtz & Volek PC

(57) ABSTRACT

According to one embodiment, a semiconductor memory device includes a magnetoresistive element and an insulating layer. The magnetoresistive element includes a first magnetic layer, a nonmagnetic layer, and a second magnetic layer and. The magnetoresistive element is capable of storing data according to a direction of magnetization in the first magnetic layer. The insulating layer covers a side surface of the magnetoresistive element. The first magnetic layer includes a first region and a second region. Each of the first and second regions includes a magnetic material and a nonmagnetic material. A concentration ratio of the nonmagnetic material to the magnetic material is higher in the second region than in the first region.

19 Claims, 16 Drawing Sheets

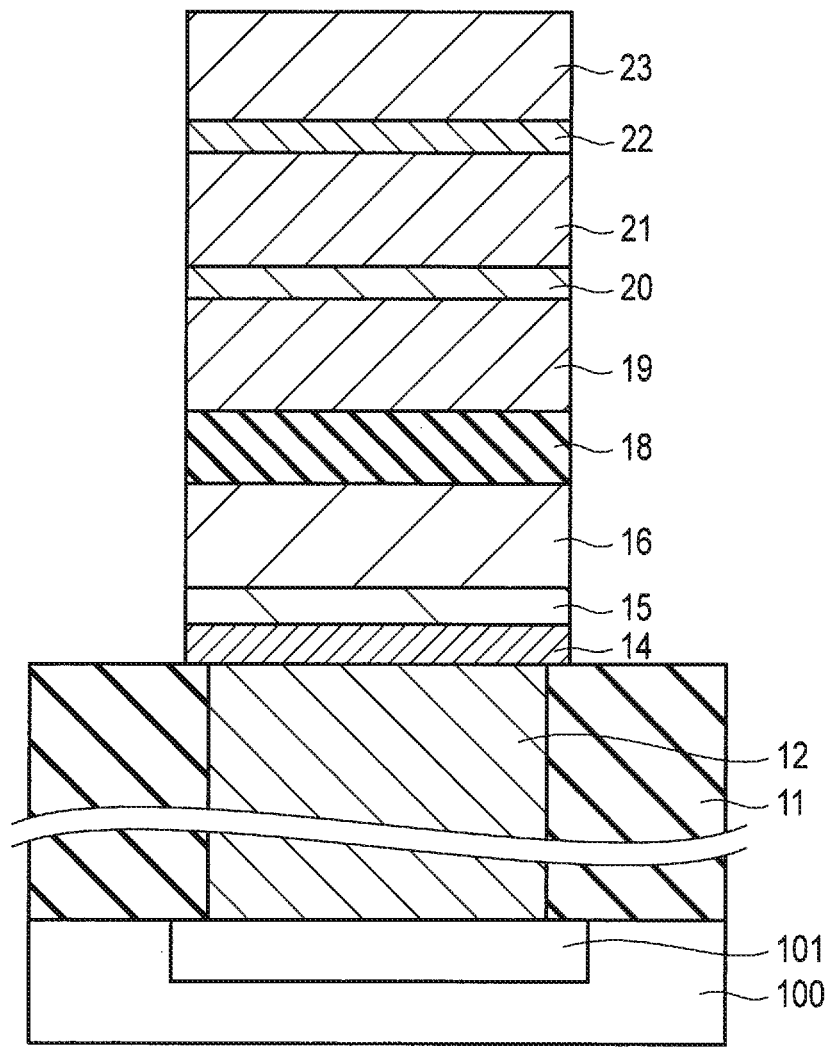
F I G. 5

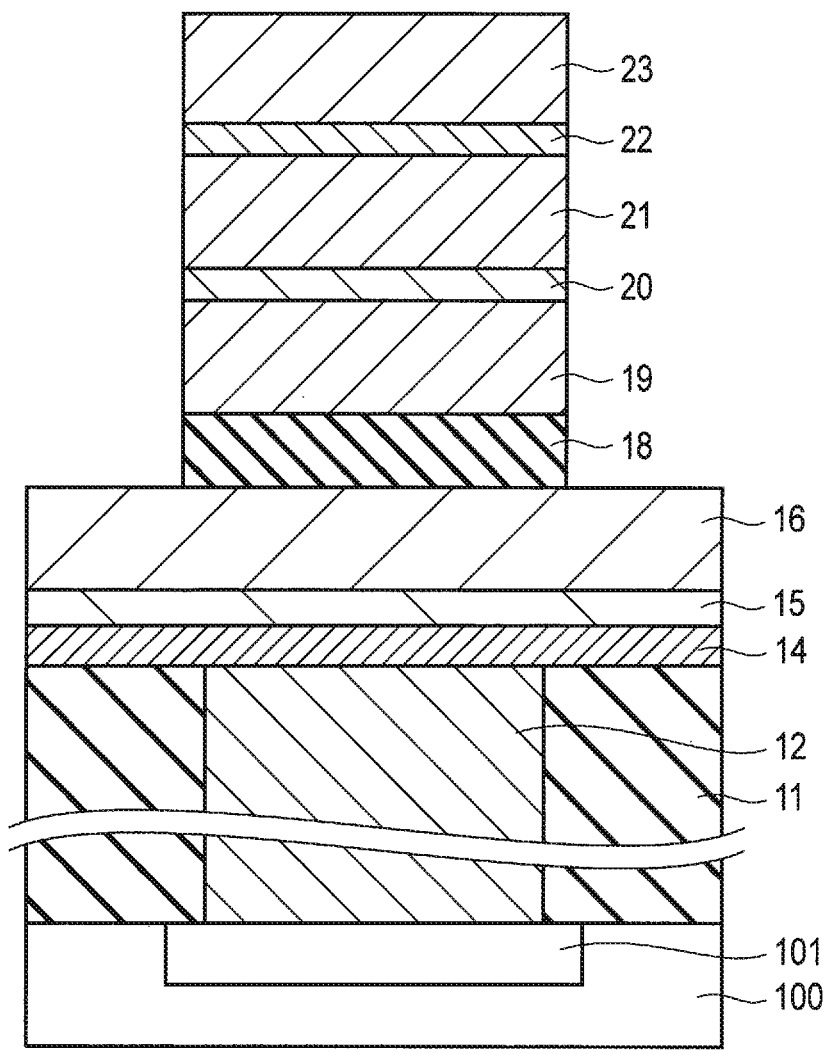
F I G. 13

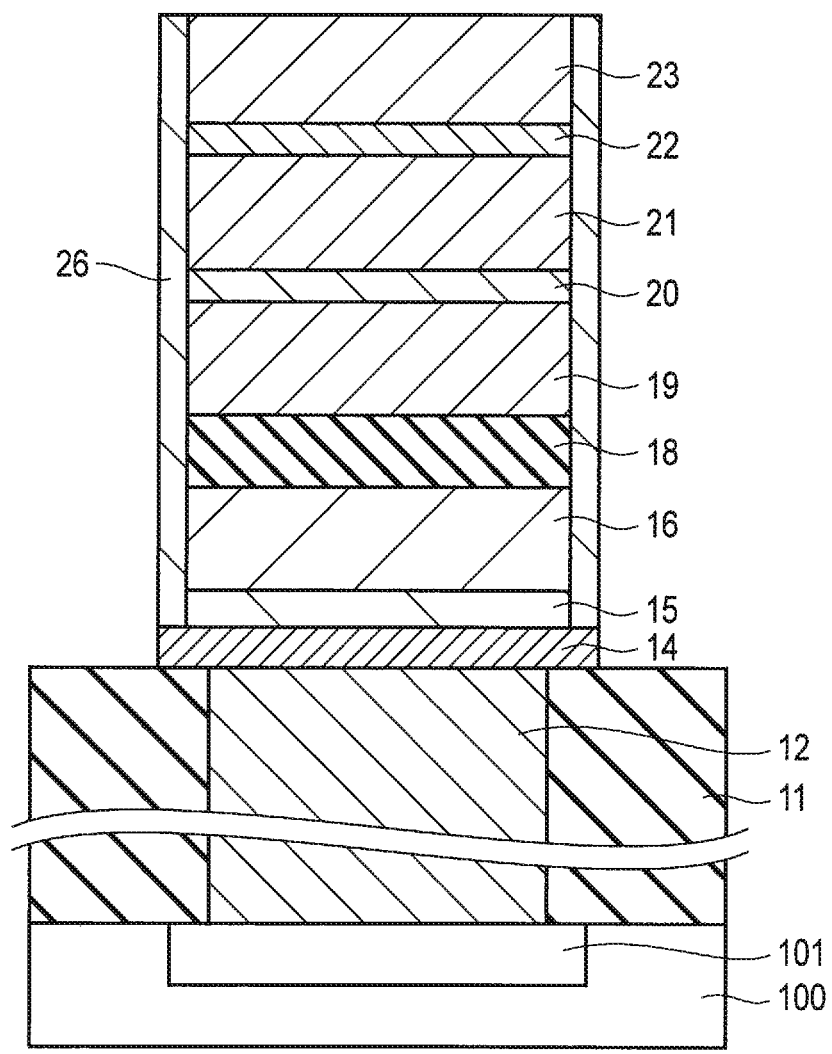
F I G. 14

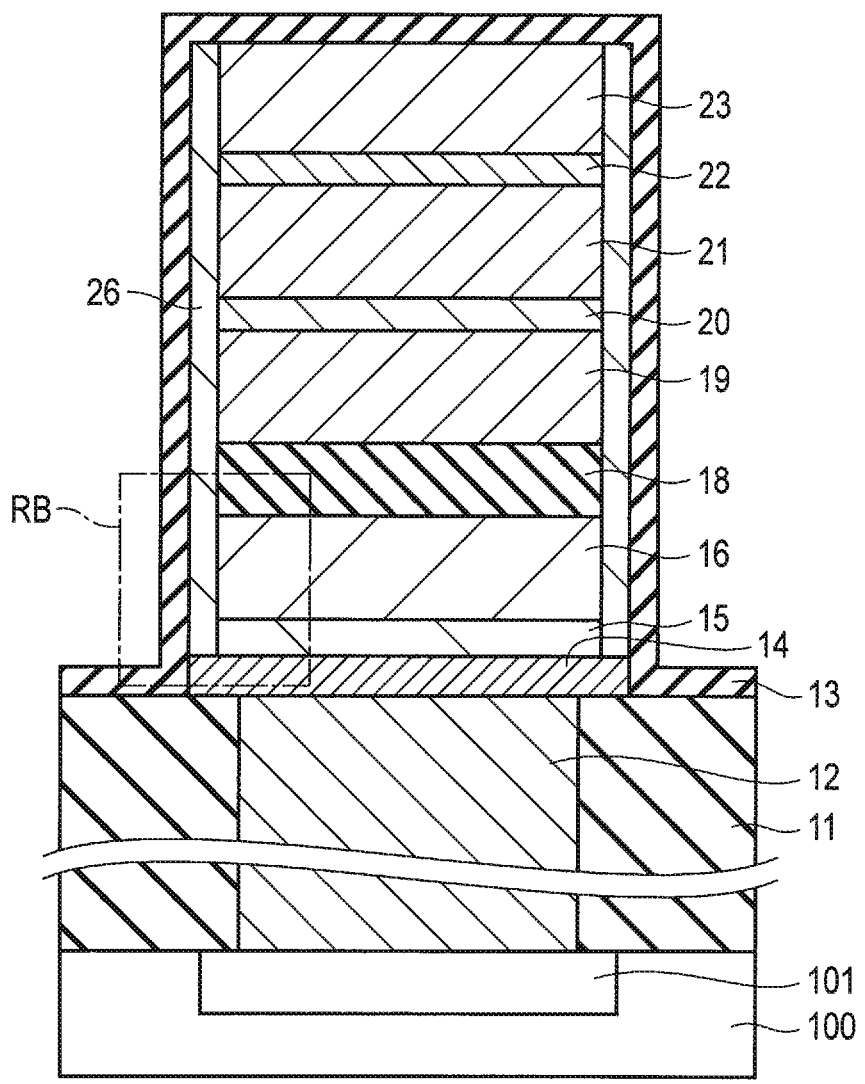
F I G. 15

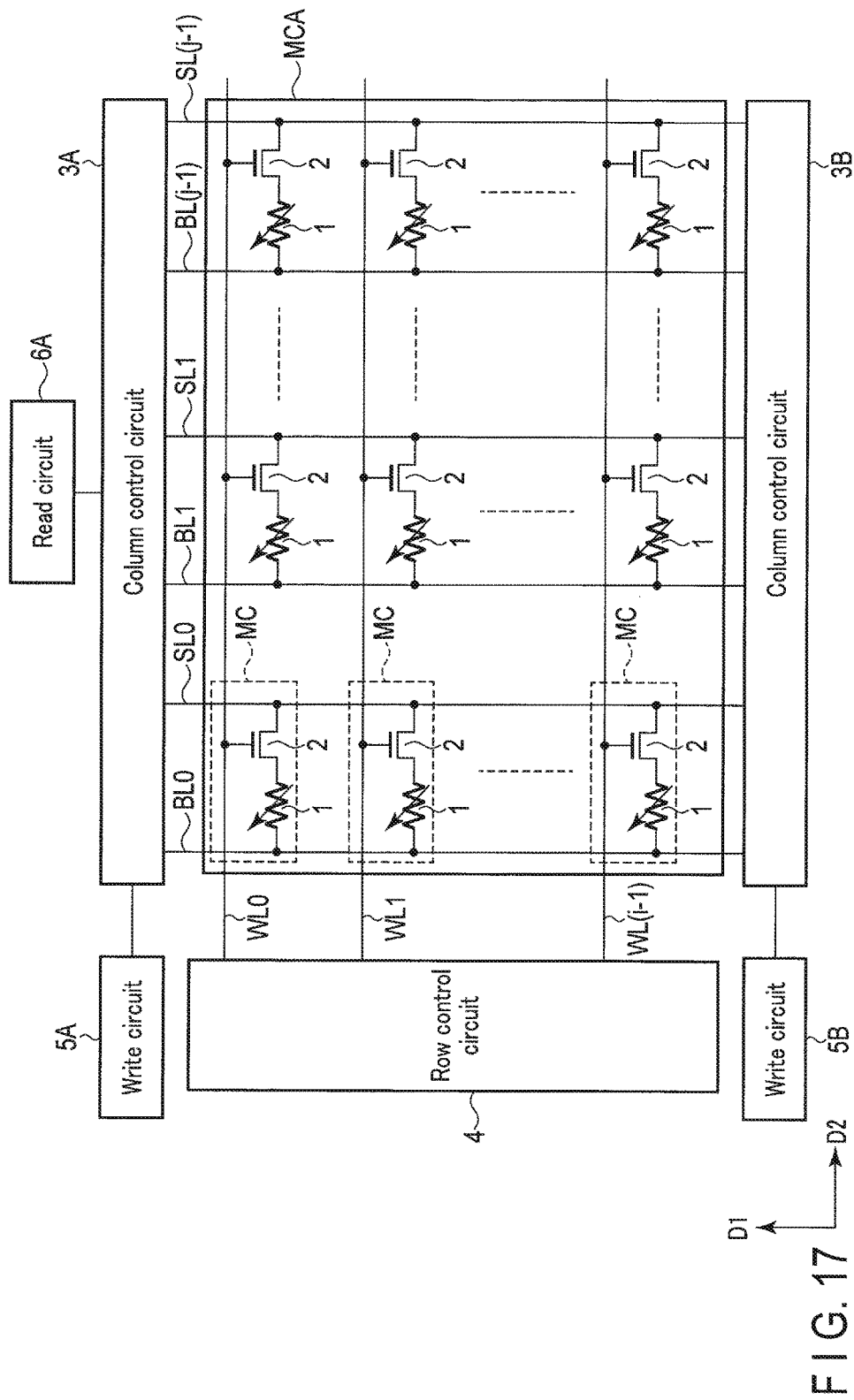
F I G. 17

SEMICONDUCTOR MEMORY DEVICE WITH MAGNETORESISTIVE ELEMENT

CROSS-REFERENCE TO RELATED APPLICATIONS

This application claims the benefit of U.S. Provisional Application No. 62/394,151, filed Sep. 13, 2016, the entire contents of which are incorporated herein by reference.

FIELD

Embodiments described herein relate generally to a semiconductor memory device.

BACKGROUND

As a type of semiconductor memory device, a semiconductor memory device including a resistance random access memory (ReRAM) is known. Furthermore, as a type of ReRAM, for example, a spin-transfer-torque magneto-resistive random access memory (STT-MRAM) is known. The STT-MRAM is a memory device including magnetic elements having a magneto-resistive effect, as memory cells that store information. The STT-MRAM has been drawing attention as a next-generation memory device characterized by its high-speed operation, large capacity, and non-volatility. Research and development efforts have been made to allow the STT-MRAM to be used as an alternative to volatile memories such as DRAM and SRAM.

BRIEF DESCRIPTION OF THE DRAWINGS

FIGS. 3 to 7 are sectional views of the MTJ element provided in the semiconductor memory device according to the first embodiment, illustrating a process of manufacturing the MTJ element;

FIGS. 13 to 15 are sectional views of the MTJ element provided in the semiconductor memory device according to the third embodiment, illustrating the process of manufacturing the MTJ element;

FIG. 17 is a block diagram of a semiconductor memory device according to a fourth embodiment.

DETAILED DESCRIPTION

Figure 1:
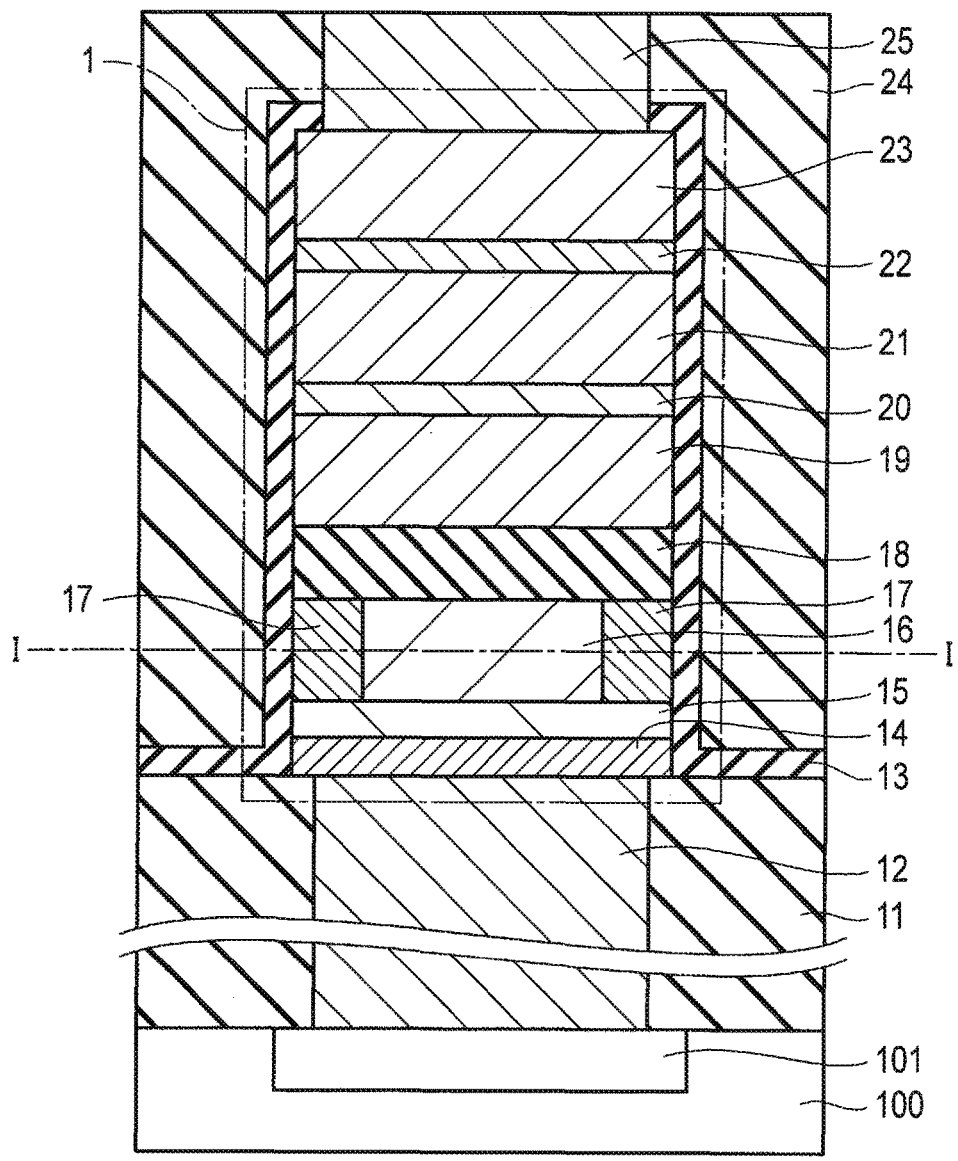
FIG. 1 is a sectional view of an MTJ element in a semiconductor memory device according to a first embodiment.

In general, according to one embodiment, a semiconductor memory device includes a magnetoresistive element and an insulating layer. The magnetoresistive element includes a first magnetic layer, a nonmagnetic layer, and a second magnetic layer. The magnetoresistive element is capable of storing data according to a direction of magnetization in the first magnetic layer. The insulating layer covers a side surface of the magnetoresistive element. The first magnetic layer includes a first region and a second region provided between the insulating layer and the first region. Each of the first and second regions includes a magnetic material and a nonmagnetic material. A concentration ratio of the nonmagnetic material to the magnetic material is higher in the second region than in the first region.

1. First Embodiment

A semiconductor memory device according to a first embodiment will be described. In the first embodiment, as a semiconductor memory device, an STT-MRAM will be described, by way of example, which stores data using magnetic tunnel junction elements (MTJ elements).

In the semiconductor memory device, writing errors are often corrected by signal processing using ECC (Error Correction Code) or the like. However, ECC processing needs a time for correction calculation processing, and thus, the use of ECC processing is advantageously avoided in order to increase an operating speed of memory. To achieve this, a writing error rate (WER) needs to be improved.

For the STT-MRAM which performs data writing by controlling the direction of magnetization in a storage layer, a reduction in WER needs control not only of a magnetization reversal current (writing current) in the storage layer but also of behavior of magnetization reversal in the storage layer. In particular, when the size of the storage layer is larger than a single magnetic domain size (Ds), a plurality of magnetic domains is generated in the storage layer. In this case, the magnetization reversal in the storage layer is not coherent reversal in which the directions of magnetization in the storage layer are concurrently reversed but magnetization reversal in a magnetic domain wall motion mode (magnetic domain wall motion reversal) in which magnetization reversal in magnetic domain sequentially progresses.

In the magnetic domain wall motion mode, magnetic domain wall formed between magnetic domains with different directions of magnetization move in conjunction with magnetization reversal in the magnetic domains. Thus, if writing is executed with a certain writing current pulse width, when the magnetization reversal in the entire storage layer fails to end within a pulse application period and magnetic walls remain, a writing error may occur. Therefore, the size of the MTJ element (storage layer) and the pulse width of the writing current significantly affect the WER.

For MTJ elements having a storage layer with a short-side length of larger than 100 nm, effective magnetic anisotropy energy (Ku-effect) in the storage layer needs to be controlled in order to control formation energy for the magnetic domains. The Ku-effect can be controlled by appropriately setting saturation magnetization (Ms) in the storage layer and material itself magnetic anisotropy energy (Ku-intrinsic) in the storage layer itself. The Ku-intrinsic is the sum of crystal magnetic anisotropy energy (Ku-bulk) and interface magnetic anisotropy energy (Ku-interface).

For example, materials such as a CoPt alloy, a CoPd alloy, or an FePt alloy have a large Ku-bulk of $5 \times 10^5$ erg/cc or more. For multilayer films such as Co/Pt or Co/Pd or a combination of a tunnel barrier layer and a storage layer such as MgO/CoFeB or MgO/CoFe, the Ku-interface is dominant.

However, the area ratio of the MTJ edge to the total area of the MTJ element increases with reducing the MTJ element size. Thus, the magnetic anisotropy energy formed at a storage layer edge region (Ku-edge) has a greater impact, making control of the Ku-effect difficult. The Ku-effect of the entire storage layer is approximately equal to the sum of the Ku-effect (Center) at a storage layer central region (a value obtained by subtracting, from the Ku-intrinsic, demagnetization field energy resulting from the impact of Ms in the storage layer itself) and the Ku-edge. Therefore, at the storage layer edge region, an increase in Ku-edge increases the Ku-effect. In this case, the Ku-effect is distributed in the storage layer.

The present inventor has found that, when the Ku-effect is distributed in the storage layer, the magnetic domain wall motion is trapped at portions in the storage layer in which the local Ku-effect is small, thus extending a dwell time of the magnetic domain wall. When the dwell time of the magnetic domain wall is extended, if the writing operation is executed with a pulse width of a certain writing current that is shorter than the dwell time of the magnetic domain wall, the magnetic domain wall is likely to remain. Thus, a case stochastically occurs where the storage layer in the MTJ element is not subjected to magnetization reversal, leading to an increase in WER.

Thus, in the present embodiment, the Ms is set lower at the storage layer edge region than at the storage layer central region in order to improve the distribution of the Ku-effect in the storage layer. A method for achieving this will be described. A decrease in Ms reduces shape magnetic anisotropy energy (Ku-shape) at the storage layer edge region provided by demagnetization fields resulting from the Ms. A reduction of Ku-shape suppresses an increase in the Ku-edge at the storage layer edge region, allowing the distribution of the Ku-effect in the storage layer to be improved. The Ku-shape is a component of the Ku-edge. As a result, the magnetic domain wall is restrained from being trapped, allowing the WER to be improved.

1.1 Configuration of the MTJ Element

Figure 2:
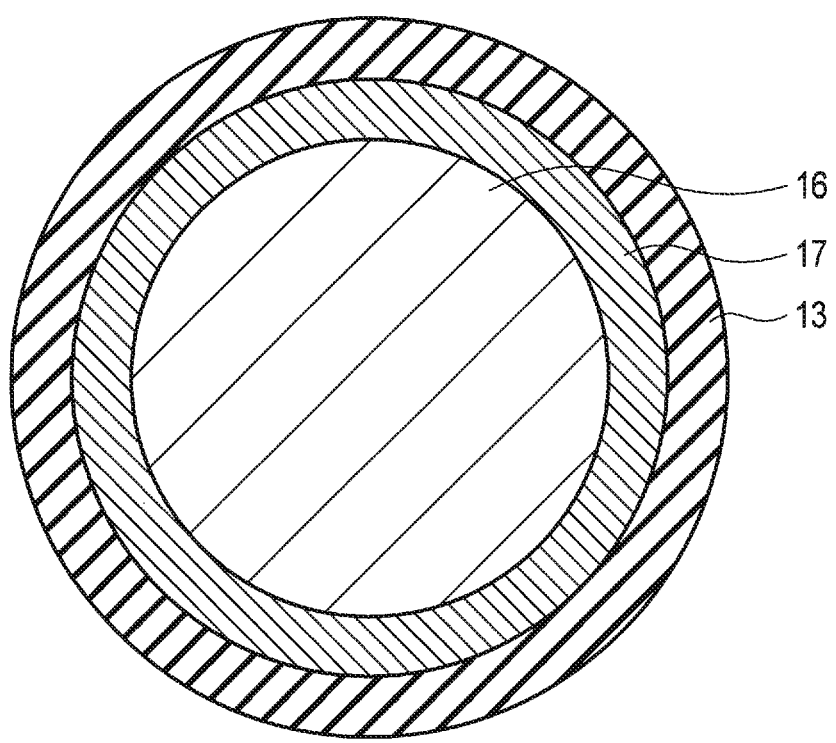
FIG. 2 is a plan view of the MTJ element taken along line I-I in FIG. 1.

First, a configuration of an MTJ element 1 will be described. FIG. 1 is a sectional view of the MTJ element 1 in a semiconductor memory device according to a first embodiment. FIG. 2 is a plan view of the MTJ element taken along line I-I in FIG. 1.

As depicted in FIG. 1, the MTJ element 1 has a bottom surface coupled, via a lower electrode contact plug (hereinafter referred to as a BEC plug) 12, to a diffusion layer 101 provided near a front surface of a semiconductor substrate 100, and a top surface coupled to, for example, a bit line BL (not depicted in the drawings) via an upper electrode contact plug (hereinafter referred to as a TEG plug) 25. Side surface and a part of the top surface of the MTJ element 1 are converted with a protection layer 13. For example, the diffusion layer 101 functions as a source/drain diffusion layer of a select transistor (not depicted in the drawings) coupled to the MTJ element, and is coupled to, for example, a source line SL (not depicted in the drawings) via the select transistor. A description "contact plug" or "plug" means a conductive layer containing a conductive material.

An insulating layer 11 is provided on the semiconductor substrate 100. For example, $SiO_2$ is used for the insulating layer 11. The insulating layer 11 may be a single layer film or a laminate film. The BEC plug 12 is provided so as to penetrate the insulating layer 11 such that a bottom surface of the BEC plug 12 reaches the diffusion layer 101. For example, tungsten (W) is used for the BEC plug 12. Furthermore, as a barrier metal that covers a bottom surface and side surface of W, tantalum (Ta), titanium (Ti), titanium nitride (TiN), tantalum nitride (TaN), or a laminate film of any of these metals is used. The MTJ element 1 is provided so as to contact a top surface of the BEC plug 12.

The MTJ element 1 includes, as basic components thereof, two magnetic layers (a storage layer (regions 16 and 17) and a reference layer 19) and a nonmagnetic layer (tunnel barrier layer 18) sandwiched between the magnetic layers. An insulating layer is used for the tunnel barrier layer 18. The storage layer includes regions 16 and 17. The direction of magnetization in the storage layer (regions 16 and 17) is variable, and the direction of magnetization in the reference layer 19 is invariable (fixed state). That is, the magnetization reversal current in the storage layer (regions 16 and 17) is smaller than the magnetization reversal current in the reference layer 19. The magnetization reversal current is a current that enables to reverse the magnetization of the magnetic layer.

When the direction of magnetization in the storage layer (regions 16 and 17) is the same as the direction of magnetization in the reference layer 19 (the MTJ element 1 is in a magnetization parallel arrangement state), the MTJ element 1 has a first resistance state (first resistance value). When the direction of magnetization in the storage layer (regions 16 and 17) is different from the direction of magnetization in the reference layer 19 (the MTJ element 1 is in a magnetization antiparallel arrangement state), the MTJ element 1 has a second resistance state (second resistance value). The MTJ element 1 has a smaller resistance value in the first resistance state than in the second resistance state. Consequently, the MTJ element 1 can store data, for example, such that the first and second resistance states are represented by data "0" and "1", respectively. Allocation of data to the resistance states of the MTJ element 1 can be optionally set.

In the MTJ element 1 in the present embodiment, the following layers are provided in the following order from bottom to top: a buffer layer 14, an underlayer 15, the storage layer (regions 16 and 17), the tunnel barrier layer 18, the reference layer 19, a spacer layer 20, a shift cancel layer 21, a cap layer 22, and a hard mask layer 23. The buffer layer 14 and the underlayer 15 electrically couple the storage layer (regions 16 and 17) to the BEC plug 12. The reference layer 19 is electrically coupled to the TEC plug 25 via the spacer layer 20, the shift cancel layer 21, and the cap layer 22.

The storage layer (regions 16 and 17), the reference layer 19, and the shift cancel layer 21 are, for example, magnetic layers having perpendicular magnetic anisotropy. The magnetization (magnetization direction) in the storage layer (regions 16 and 17), the reference layer 19, and the shift cancel layer 21 is substantially perpendicular to layer surfaces (film surfaces). The direction of magnetization in the storage 1 layer (regions 16 and 17) is variable, and the direction of magnetization in the reference layer 19 and the shift cancel layer 21 is invariable (fixed state). The direction of magnetization in the shift cancel layer 21 is set antiparallel to the direction of magnetization in the reference layer 19 to adjust magnetic fields leaking from the reference layer 19 to the storage layer (regions 16 and 17).

Arrangement of the storage layer regions 16 and 17 will be described using FIG. 2. As depicted in FIG. 2, the planar shape of the MTJ element is, for example, a circle. The storage layer region 17 is an inner peripheral region (hereinafter referred to as the "storage layer edge region") in the storage layer which is in contact with the protection layer 13, and the storage layer region 16 is a central region in the storage layer (hereinafter referred to as the "storage layer central region"). The concentration (composition ratio) of a magnetic material is lower in the storage layer region 17 than in the storage layer region 16. That is, the concentration of a nonmagnetic material is higher in the storage layer region 17 than in the storage layer region 16. The planar shape of the MTJ element 1 is not limited to this and may be in various forms.

Description will be given which relates to the concentrations of the magnetic materials in the storage layer regions 16 and 17, that is, the ratio of the magnetic materials to the total amount of elements contained in the storage layer regions 16 and 17. However, this may be represented by the concentration ratio of the nonmagnetic material (nonmagnetic element) to the magnetic material (magnetic element) in the storage layer. For example, to indicate that "the concentration of the nonmagnetic material is higher in the storage layer region 17 than in the storage layer region 16", it is possible to use the description "the concentration ratio of the nonmagnetic material to the magnetic material is (relatively) higher in the storage layer region 17 than in the storage layer region 16.

The concentration of the nonmagnetic element or the concentration ratio of the nonmagnetic material to the magnetic material is determined by EDX analysis and EELS analysis described below.

The storage layer (regions 16 and 17) is, for example, magnetic layer having perpendicular magnetic anisotropy. The magnetization (magnetization direction) is variable and generally perpendicular to the layer surfaces (film surfaces). For the storage layer regions 16 and 17, for example, an alloy containing at least one of cobalt (Co), iron (Fe), and nickel (Ni) is used. More specifically, cobalt iron boron alloy (CoFeB), iron boron alloy (FeB), or the like may be used. When CoFeB is used, the composition ratio between Co and Fe is preferably such that the composition contains 50% or more Fe. For example, if magnesium oxide (MgO) is used as the tunnel barrier layer 18, when the ratio of Fe is 50% or more, CoFeB is likely to have a BCC (Body-Centered Cubic) structure, which has a low degree of lattice mismatch. Furthermore, the B concentration in CoFeB is preferably 10 at % or more and 30 at % or less in order to facilitate formation of a microcrystalline layer or an amorphous layer with a diameter of 1 nm or less when CoFeB is formed into a film.

A case will be described where CoFeB is used for the storage layer regions 16 and 17. The storage layer regions 16 and 17 in the present embodiment are different from each other in the composition ratio between CoFe, which is a magnetic material, and B, which is a nonmagnetic material. The composition ratio of CoFe is lower in the storage layer region 17 than in the storage layer region 16. Due to the low CoFe concentration of the storage layer region 17 (storage layer edge region), the saturation magnetization (Ms) is lower in the storage layer region 17 than in the storage layer region 16 (storage layer central region). A decrease in Ms reduces the shape magnetic anisotropy energy (Ku-shape) provided by demagnetization fields resulting from the Ms. That is, adjustment of the Ms allows the Ku-shape of the storage layer to be adjusted.

A film composition of the storage layer region 17 need not be uniform from an interface between the storage layer region 17 and the protection layer 13 toward an interface between the storage layer region 17 and the storage layer region 16. The CoFe concentration in the storage layer region 17 may gradually decrease from the interface between the storage layer region 17 and the storage layer region 16 toward the interface between the storage layer region 17 and the protection layer 13. That is, the B concentration of the storage layer region 17 may gradually increase from the interface between the storage layer region 17 and the storage layer region 16 toward the interface between the storage layer region 17 and the protection layer 13.

In the present embodiment, a case will be described below where the storage layer region 17 is formed by implanting B into the storage layer edge region via the protection layer 13. In this case, since the B concentration gradually decreases from the interface between the storage layer region 17 and the protection layer 13 toward the storage layer region 16, the interface between the storage layer region 16 and the storage layer region 17 need not be well-defined.

The element implanted to the storage layer edge region is not limited to B. Any implanted element may be used so long as the element is a nonmagnetic material. For example, carbon (C), nitrogen (N), or phosphorous (P) may be used as the implanted element.

In terms of a reduction in saturation magnetization Ms, B, C, P, and N produces substantially equivalent effects and may thus be interchangeable.

Moreover, although less effective for attenuating the saturation magnetization Ms, one of neon (Ne), argon (Ar), krypton (Kr), and xenon (Xe) which are inactive gases may be used. In this case, a saturation magnetization (Ms) reduction effect is performed by amorphization of the storage layer region 17 rather than by the simple attenuation effect. That is, the reduction effect results from a difference in crystal structure between the crystalline material in the storage layer region 16 and the amorphous material in the storage layer region 17.

B and C are least effective for reducing an TMR ratio (tunneling magneto-resistive ratio) in the MTJ element 1. This characteristic is prominent when CoFeB is used for the storage layer regions 16 and 17 and MgO is used for the tunnel barrier layer 18.

Furthermore, B, C, N, and P are interstitial type elements and have smaller atomic diameters than Co, Fe, Ni, Pt, and Ru, allowing minimization of magnetic characteristic fluctuation in the layers other than the storage layers.

The use of any of B, C, N, and P facilitates finetuning of the Ms compared to heavy elements such as gallium (Ga), arsenic (As), and antimony (Sb). These elements are elements having small atomic radii and that are likely to migrate between CoFe lattices, thus enabling minimization of a fluctuation in magnetic characteristics, particularly a fluctuation in Ms. Furthermore, the use of any of these elements substantially prevents serious impairing of the characteristics such as the Ms of magnetic elements such as Co, Fe, and Ni.

The tunnel barrier layer 18 is formed of an insulating film and functions as a barrier between the reference layer 19 and the storage layer (regions 16 and 17). For the tunnel barrier layer 18, for example, magnesium oxide (MgO) or aluminum oxide ($Al_2O_3$) is used. In the present embodiment, the use of MgO will be described. The tunnel barrier layer 18, which is an insulating layer, preferably has a film thickness of, for example, approximately 10 Å because an increased thickness precludes electric continuity between the reference layer 19 and the storage layer (regions 16 and 17).

Like the storage layer regions 16 and 17, the reference layer 19 and the shift cancel layer 21 are, for example, magnetic layers having perpendicular magnetic anisotropy. Magnetization (magnetization direction) in the reference layer 19 and the shift cancel layer 21 is invariable (fixed state) and is substantially perpendicular to the layer surfaces (film surfaces). The direction of magnetization in the shift cancel layer 21 is set antiparallel to the direction of magnetization in the reference layer 19 to adjust magnetic fields leaking from the reference layer 19 to the storage layer regions 16 and 17.

For the reference layer 19 and the shift cancel layer 21, for example, an alloy film mainly containing cobalt (Co) and platinum (Pt) or palladium (Pd), or a multilayer film of these metals may be used. More specifically, cobalt platinum alloy (CoPt), cobalt nickel alloy (CoNi), cobalt palladium alloy (CoPd), a Co/Pt multilayer film, or a Co/Pt multilayer film may be used. Alternatively, the reference layer 19 and the shift cancel layer 21 may have the same structure.

The reference layer 19 may include an interface layer (not depicted in the drawings) provided at the interface between the reference layer 19 and the tunnel barrier layer 18, and an intermediate layer (not depicted in the drawings) provided on the interface layer. The interface layer is formed of, for example, a material with a high polarization rate. The MTJ element 1 with the interface layer provided therein can produce a high TMR (tunneling magneto resistive) effect. As the interface layer, a material is desirably selected which has only a slight lattice mismatch with the tunnel barrier layer 18. For example, when the tunnel barrier layer 18 is MgO, a cobalt CoFeB layer may be provided as an interface layer. In this case, the B concentration of the CoFeB layer is preferably 10 at % or more and 30 at % or less.

Furthermore, the intermediate layer prevents metal elements from diffusing between the interface layer and the reference layer 19. For the intermediate layer, a film may be used which is formed of Ta, zinc (Zr), W, hafnium (Hf), molybdenum (Mo), niobium (Nb), Ti, chromium (Cr), vanadium (V), or a nitrogen (N) or carbon (C) compound of any of these elements.

The spacer layer 20 is a nonmagnetic layer provided between the reference layer 19 and the shift cancel layer 21. The spacer layer 20 offers heat resistance to prevent thermal diffusion and provides a function to control crystal orientation. For the spacer layer 20, for example, Ru or osmium (Os) is used. An increased film thickness of the spacer layer 20 increases the distance between the shift cancel layer 21 and the reference layer 19. This reduces the magnitude of magnetic fields applied to the reference layer 19 by the shift cancel layer 21. Thus, the film thickness of the spacer layer 20 is preferably, for example, 5 nm or less.

The reference layer 19, the spacer layer 20, and the shift cancel layer 21 may be configured to have an SAF (synthetic anti-ferromagnetic) structure. Moreover, for the reference layer 19, an SAF structure containing CoFeB and a Co/Pt multilayer film may be used. In this case, Ru is used as the intermediate layer between the CoFeB and the Co/Pt multilayer film.

The buffer layer 14 contains, for example, aluminum (Al), beryllium (Be), magnesium (Mg), calcium (Ca), strontium (Sr), barium (Ba), scandium (Sc), yttrium (Y), lanthanum (La), Si, Zr, Hf, W, Cr, Mo, Nb, Ti, Ta, or V. The buffer layer 14 may also contain a boride of any of these elements. The boride is not limited to a binary compound formed of two types of elements but may be a ternary compound formed of three types of elements. In other words, a mixture of binary compounds may be used. For example, the boride or the Boron alloy may be hafnium boride or alloy (HfB), magnesium aluminum boride or alloy (MgAlB), hafnium aluminum boride or alloy (HfAlB), scandium aluminum boride or alloy (ScAlB), scandium hafnium boride or alloy (ScHfB), or hafnium magnesium boride or alloy (HfMgB). Alternatively, these materials may be laminated together. The use of a high-melting-point metal and a boride thereof enables suppression of diffusion of the buffer layer material to the magnetic layers, allowing deterioration of the MR ratio to be prevented. Here, the high-melting-point metal is a material having a higher melting point than Fe and Co, and is, for example, Zr, Hf, W, Mo, Nb, Ti, Ta, and V, and an alloy thereof.

The underlayer 15 contains, for example, a nitrogen compound or an oxygen compound such as magnesium oxide (MgO), magnesium nitride (MgN), zirconium nitride (ZrN), niobium nitride (NbN), silicon nitride (SiN), aluminum nitride (AlN), hafnium nitride (HfN), tantalum nitride (TaN), tungsten nitride (WN), chromium nitride (CrN), molybdenum nitride (MoN), titanium nitride (TiN), or vanadium nitride (VN). Moreover, the underlayer 15 may be a nitrogen compound or an oxygen compound containing two of Mg, Zr, Nb, Si, Al, Hf, Ta, W, Cr, Mo, Ti, and V. In other words, the underlayer 15 is not limited to a binary compound formed of two types of elements but may be a ternary compound formed of three types of elements such as aluminum titanium nitride (AlTiN). The nitrogen compound and the oxygen compound suppress an increase in a damping constant for the magnetic layer in contact with the nitrogen or oxygen compound, effectively reducing the writing current. Moreover, the use of the nitrogen or oxygen compound of the high-melting-point metal enables suppression of diffusion of the underlayer material to the magnetic layers, allowing deterioration of the MR ratio to be prevented.

The cap layer 22 suppresses reaction between the shift cancel layer 21 and the hard mask layer 23. The cap layer 22 may contain Pt, W, Ta, or Ru.

For example, a metal film is used for the hard mask layer 23. The hard mask layer 23 not only functions as an electrode but is also used as a mask when the MTJ element 1 is etched. Thus, the hard mask layer 23 is desirably a material that offers low electric resistance and high diffusion resistance and that is excellent in etching resistance or milling resistance. For the hard mask layer 23, for example, a single layer mask such as W, Ta, TaN, Ti, TiN, Pt, or Ru, or a laminate film containing these films may be used. As the hard mask layer 23, an insulating material such as SiO2 or SiN may be used. In this case, the TEC plug 25 is formed to penetrate the hard mask layer 23 such that a bottom of the TEC plug 25 contacts the cap layer 22.

The protection layer 13 is formed so as to cover a part of a top surface and side surface of the MTJ element 1. The protection layer 13 is preferably an insulating material having a lower oxygen and moisture permeability than the insulating layer 24 (for example, $SiO_2$) in order to prevent the MTJ element 1 from being oxidized. For the protection layer 13, a nitride film, an oxide film, or a oxynitride film of Si, Al, B, or Mg may be used. For example, silicon nitride (SiN), aluminum nitride (AlN), aluminum oxide ($Al_2O_3$), silicon carbide (SiC), silicon oxynitride (SiON), silicon carbonitride (SiCN), MgO, or DLC (diamond like carbon) may be used for the protection layer 13. The protection layer 13 may be a single layer film and may be, for example, a multilayer film of these films.

Moreover, the height position (the position in a normal direction of the semiconductor substrate 100) of a bottom surface of the protection layer 13 in contact with the insulating layer 11 may be the same as or lower than the height position of a bottom surface of the buffer layer 14. The height position of the bottom surface of the protection layer 13 depends on etching conditions for the MTJ element 1. More specifically, over-etching during etching of the MTJ element 1 allows the surfaces of the insulating layer 11 to be etched. Thus, the amount of over-etching determines the height position of the bottom surface of the protection layer 13.

The insulating layer 24 is provided so as to cover the protection layer 13. For example, $SiO_2$ is used for the insulating layer 24.

The TEC plug 25 is provided so as to penetrate the insulating layer 24 and the protection layer 13 on the top surface of the MTJ element 1 such that a bottom of the TEC plug 25 is in contact with the hard mask layer 23. For example, Cu, Al, or W is used for the TEC plug 25.

In FIG. 1, in the MTJ element 1, the layers may be provided in the following order from bottom to top: the shift cancel layer 21, the spacer layer 20, the reference layer 19, the tunnel barrier layer 18, and the storage layer (regions 16 and 17). That is, the MTJ element 1 may be configured such that the storage layer (regions 16 and 17) is arranged on the reference layer 19 via the tunnel barrier layer 18.

Moreover, the MTJ element 1 is provided immediately above the BEC plug, but may be provided at a position displaced from the position immediately above the BEC plug 12, for example, using an intermediate interconnect layer.

Moreover, the sectional shape of the MTJ element 1 is not particularly limited. Depending on the etching characteristic of the MTJ element 1, the sectional shape of the MTJ element 1 may be a rectangular parallelepiped or a trapezoid with an upper base shorter than a lower base or may be such that the layers of the MTJ element 1 are stepped.

Moreover, the film thickness of each of the layers of the MTJ element 1 is optional. In the present embodiment, the film thickness and the like of the storage layer regions 16 and 17 or the tunnel barrier layer 18 are depicted to be relatively thick for easy description.

1.2 Manufacturing Method for the MTJ Element

Now, a manufacturing method for the MTJ element 1 will be described.

Figure 6:
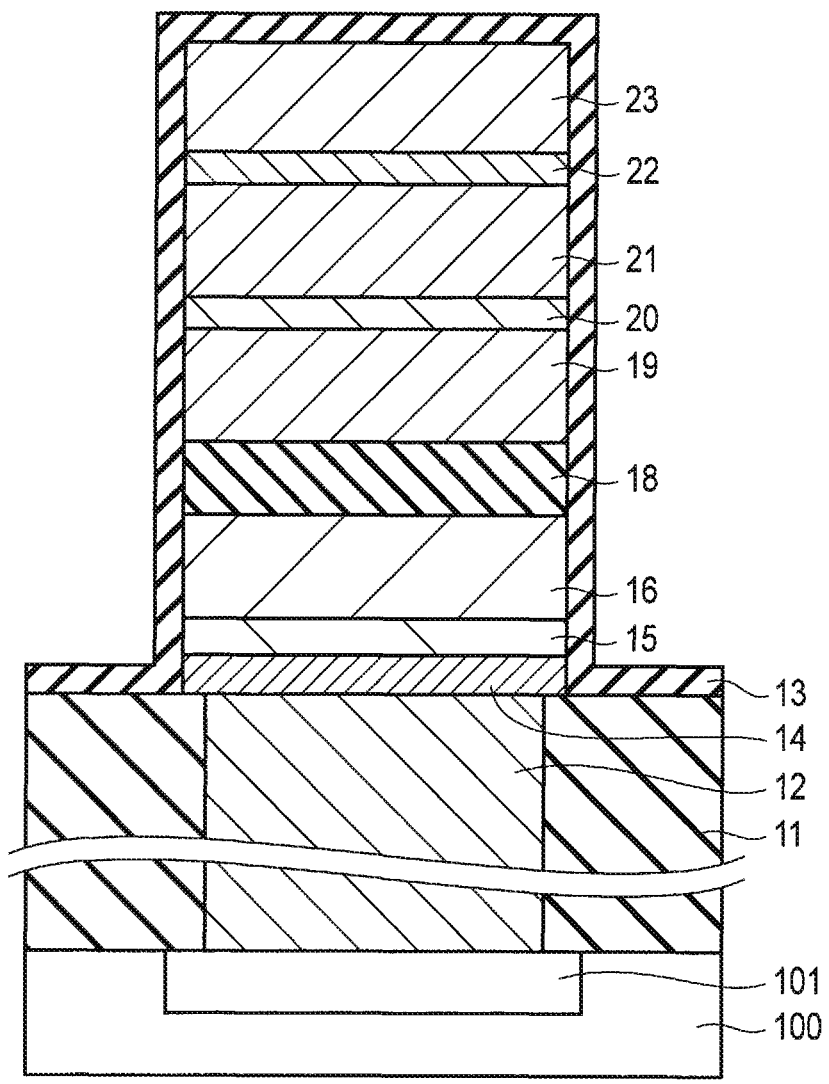
Figure 7:
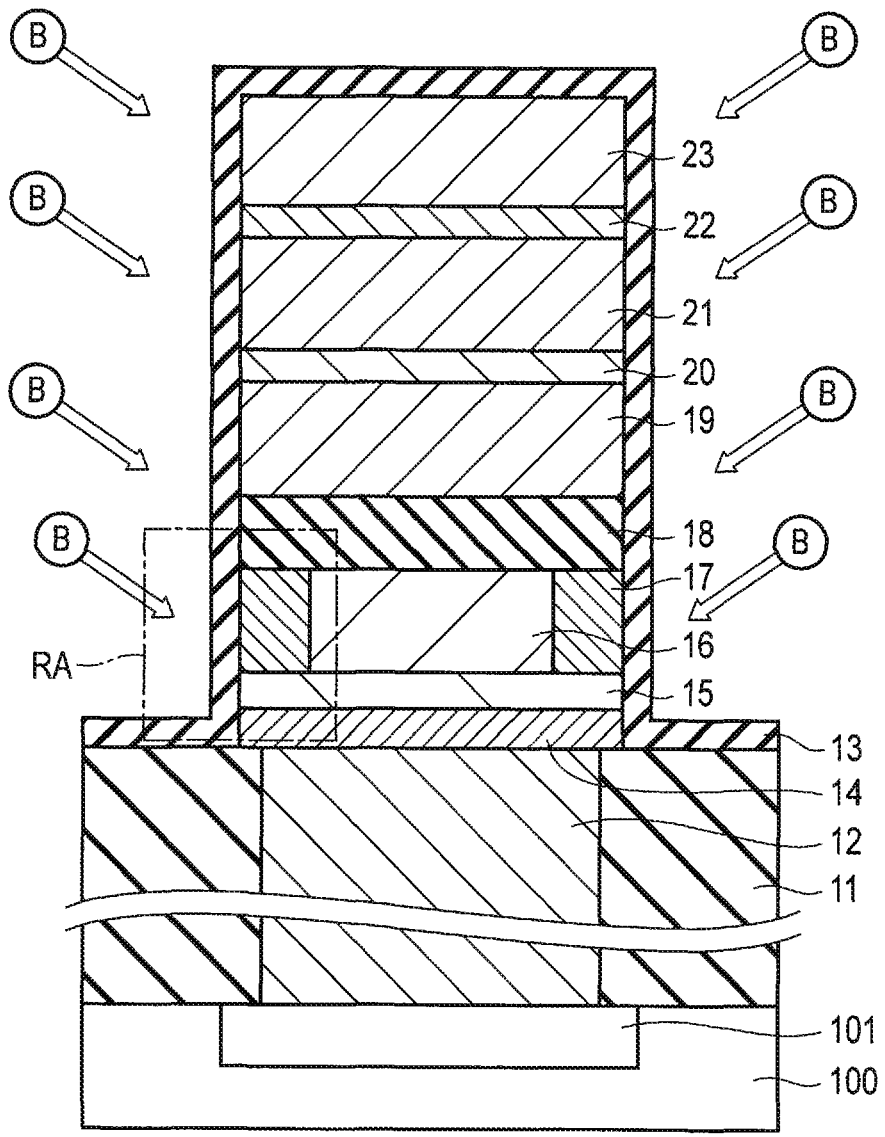
Figure 8:
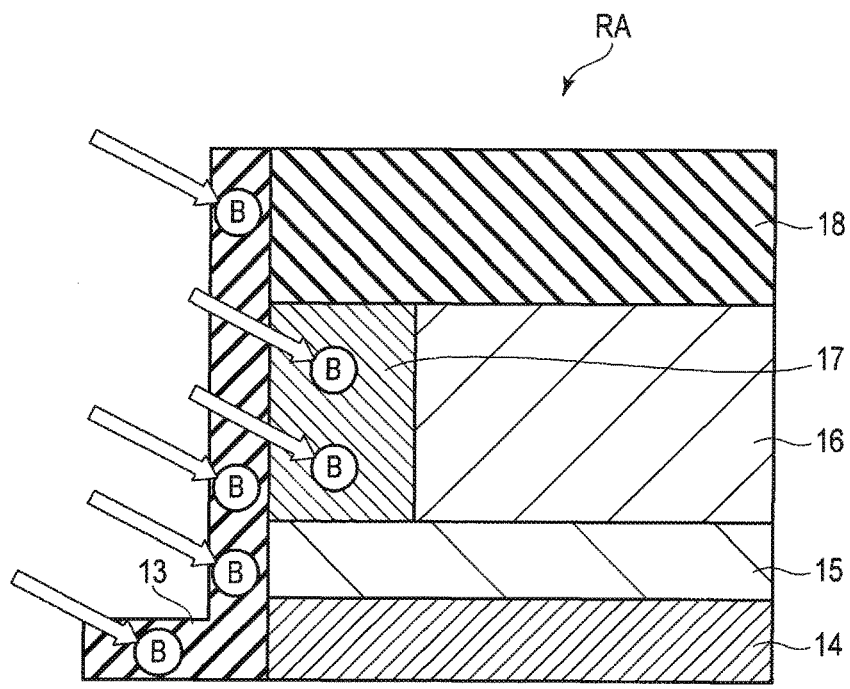
FIG. 8 is a sectional view of an area RA illustrating the process of manufacturing the MTJ element provided in the semiconductor memory device according to the first embodiment.

FIGS. 3 to 8 are sectional views of the MTJ element 1 illustrating a manufacturing process for the MTJ element 1 provided in the semiconductor memory device according to the first embodiment. FIG. 8 illustrates an area RA 2 depicted in FIG. 7.

Figure 3:
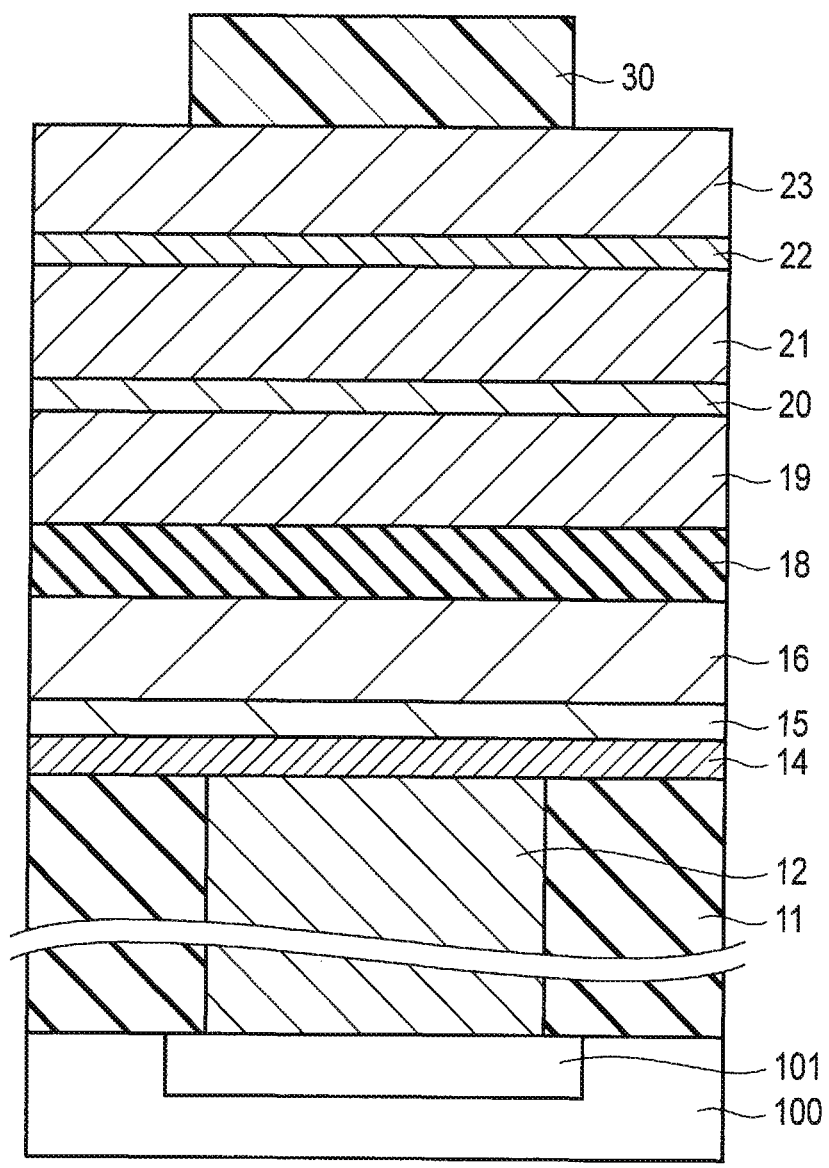

As depicted in FIG. 3, a well-known manufacturing method is used to form the diffusion layer 101 on the semiconductor substrate 100 and then to form the insulating layer 11 on the semiconductor substrate 100. Then, in the insulating layer 11, the BEC plug 12 which reaches the diffusion layer 101 is formed. Then, the following layers are sequentially laminated onto the insulating layer 11 and the BEC plug 12: the buffer layer 14, the underlayer 15, the storage layer (the storage layer is simply called "storage layer 16" when the region 17 is not formed), the tunnel barrier layer 18, the reference layer 19, the spacer layer 20, shift cancel layer 21, the cap layer 22, and the hard mask layer 23. Then, a resist 30 is applied onto the hard mask layer 23, and photolithography is used to form a mask pattern for etching of the hard mask layer 23. The resist 30 may be a laminated film. For example, between the resist 30 and the hard mask layer 23, another material may be provided which exhibits etching selectivity with respect to the hard mask layer 23. For example, when the hard mask layer 23 is a metal film, an insulating material such as $SiO_2$ or SiN may be provided between the resist 30 and the hard mask layer 23.

Figure 4:
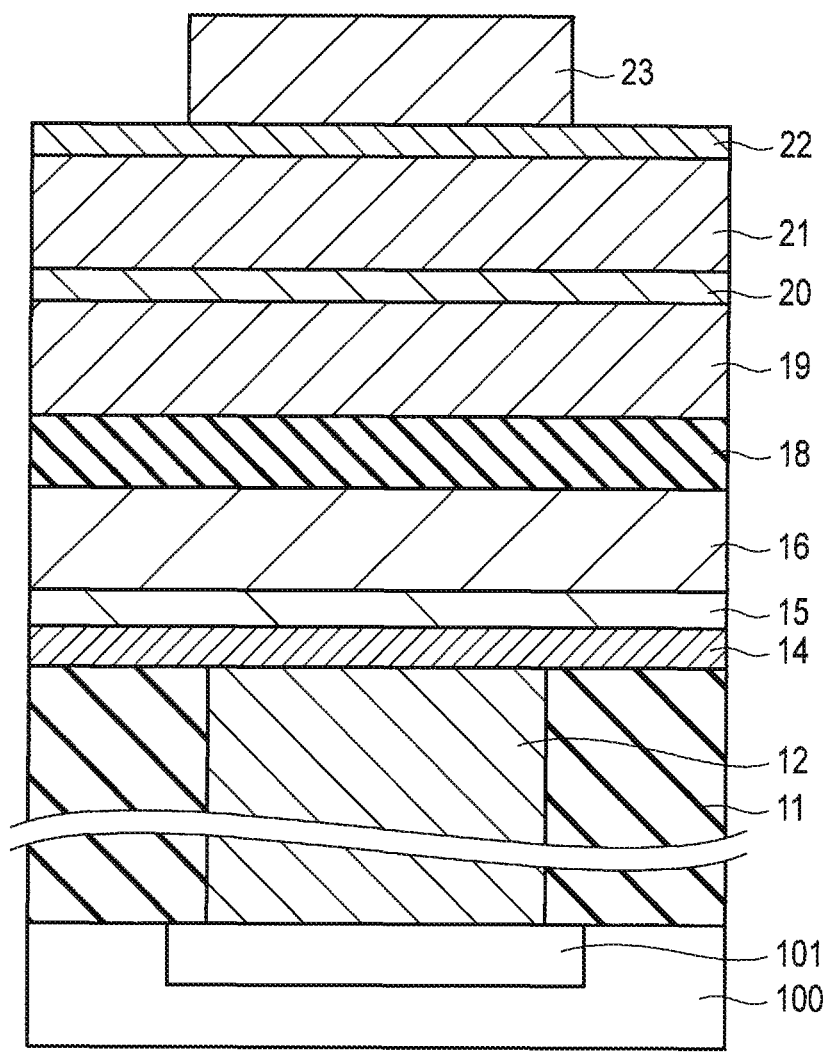

As depicted in FIG. 4, the hard mask layer 23 is etched using the resist 30 as a mask. After the hard mask layer 23 is etched, the resist 30 is peeled off.

As depicted in FIG. 5, the layers from the cap layer 22 to the buffer layer 14 are etched using the etched hard mask layer 23. For this etching, a physical etching method is used which is based on IBE (ion beam etching) using an inert gas such as neon (Ne), xenon (Xe) and krypton (Kr). In this case, etching conditions, a process gas type, a post-treatment, and the like are desirably optimized so as to prevent an etching residue (by-product) from remaining on side walls of the MTJ element 1 during etching. RIE (reactive ion etching) may be used as an etching method.

As depicted in FIG. 6, the protection layer 13 is formed so as to cover the top surface and side surface of the MTJ element 1 and the top surface of the insulating layer 11. To restrain the side surface of the MTJ element 1 from being oxidized, IBE and deposition of the protection layer 13 are preferably performed in a total vacuum (low pressure) process. That is, after etching by IBE, deposition of the protection layer 13 is preferably performed without exposure of the semiconductor substrate 100 to the air. The total vacuum process can be achieved, for example, by using a process apparatus having an IBE-etching chamber, a deposition chamber for the protection layer 13, and a transfer chamber in which the semiconductor substrate 100 is conveyed between the etching chamber and the deposition chamber in a low pressure state.

As depicted in FIGS. 7 and 8, the storage layer region 17 is formed by ion implantation of B or plasma doping. At this time, the distribution of the B concentration in the storage layer region 17 is controlled based on a dose of ions implanted, an acceleration voltage, an implantation angle, the film thickness of the protection layer 13, and the like for the ion implantation. The width of the storage layer region 17, that is, the distribution width of implanted elements from the interface between storage layer region 17 and the protection layer 13 to the interface between the storage layer region 17 and the storage layer region 16, is preferably 2 nm or less. Moreover, when the MTJ element 1 is shaped like a cylinder or has a shape similar to a cylinder and has a diameter of 50 nm or less, the width of the storage layer region 17 is preferably 1 nm or less. Thus, the acceleration voltage for the ion implantation is preferably 1 KeV or more and 3 KeV or less. For the ion implantation, the dose is preferably $1 \times 10^{14}$ atoms/cm$^2$ or more and $5 \times 10^{16}$ atoms/cm$^2$. For plasma doping, the dose can be $5 \times 10^{16}$ atoms/cm$^2$ or more.

Although depending on the ion implantation conditions, the film thickness of the protection layer 13 is preferably 1 nm or more and 5 nm or less near the storage layer edge region at the side surface of the MTJ element 1.

These conditions are expected to increase a B concentration of approximately 1 to 5 at % at the storage layer edge region. In this case, the B concentration is preferably highest near the interface between the storage layer and the protection layer 13. The implantation angle is adjusted within the range of 0 to 45 degrees to the normal direction of the semiconductor substrate 100. When the angle is selected to be 0 degree or more, the ion implantation is performed with the rotation of the semiconductor substrate 100, for example, in steps of 45 degrees or 90 degrees with the semiconductor substrate 100 inclined to an ion beam source.

The concentration distribution of implanted elements at the storage layer can be examined by EDX (energy dispersive X-ray spectroscopy) mapping, EELS (electron energy loss spectroscopy) mapping, or the like of the cross section of the MTJ element 1. In this case, implanted ions are also detected in the protection layer 13.

A calculation method for the concentration distribution of the implanted element in the storage layer will be described in detail.

In EDX analysis, the concentration of a designated element can be calculated by identifying a profile of the element based on an energy profile of characteristic X rays generated when a substance is irradiated with electron beams and executing conversion of a peak intensity value in the profile or a numerical value resulting from intensity integral or the like of the peak intensity value.

In EELS analysis, the energy of transmitted electrons is lost in a particular energy area designated at the time of electron beam irradiation. The concentrations of a plurality of particular elements can be calculated by conversion of peak intensity values for the elements in energy loss profiles or intensity integral values near the peaks.

Furthermore, indication of the abundance ratio of the elements using EDX and EELS is commonly used. It is relatively easily possible to set the total amount of a plurality of particular elements to 100 at % and to determine the relative ratios of the amounts of the elements to the total amount. In this case, the ratios of the particular element abundances can be compared with one another at the at % level.

When the above-described EDX analysis and EELS analysis are executed, determination is desirably made from multiple perspectives, for example, by executing observation and analysis not only on a cross section perpendicular to the layer surfaces (film surfaces) in the MTJ element 1 but also on a cross section parallel to the layer surfaces (film surfaces). Furthermore, three-dimensional concentration mapping in EDX or EELS based on three-dimensional tomography or the like is desirably used.

Moreover, for concentration analysis (composition comparison) based on atom probe microscopy, concentration mapping can be three-dimensionally executed.

The calculation method for the concentration distribution of the implanted elements has been described. However, a similar method can be used to determine the concentration ratio between the magnetic material and the nonmagnetic material. In other words, the concentration ratio of the nonmagnetic material to the magnetic material is obtained by determining the ratio between the magnetic material and the nonmagnetic material for the peak intensity value or the intensity integral value for the neighborhoods of the peak in EDX or EELS.

As depicted in FIG. 8, at this time, B is also implanted into the protection layer 13. The ion implantation allows B to be implanted into the edge regions of the other layers (the buffer layer 14, the underlayer 15, the tunnel barrier layer 18, the reference layer 19, the spacer layer 20, the shift cancel layer 21, the cap layer 22, and the hard mask layer 23) and the neighborhood of the surface of the insulating layer 11. However, this does not seriously affect magnetization characteristics of the storage layer regions 16 and 17, and thus, the corresponding illustration and description are omitted.

Subsequently, as depicted in FIG. 1, the insulating layer 24 is formed, and the TEC plug 25 is formed. For the film thickness of the protection layer 13, a film thickness optimal for the ion implantation may differ from a film thickness needed to protect the side surface of the MTJ element 1. Thus, after the ion implantation, the protection layer 13 may be additionally formed. Moreover, the ion implantation may allow metal ions to be implanted into the protection layer 13 as impurities. Thus, after the ion implantation, the protection layer 13 may be temporarily removed, and then, the protection layer 13 may be formed again.

1.3 Effects Relating to the Present Embodiment

The configuration according to the present embodiment allows reliability of the semiconductor memory device to be enhanced. The present effects will be specifically described.

In the configuration according to the present embodiment, the composition ratio of the nonmagnetic material is made higher at the storage layer edge region than at the storage layer central region. More specifically, the nonmagnetic material such as B is implanted into the storage layer edge region to increase the concentration (composition ratio) of the nonmagnetic material at the storage layer edge region. This enables a reduction in the Ms at the storage layer edge region. That is, the composition ratio of the magnetic material is made lower in the storage layer region 17 than in the storage layer region 16. In other words, the composition ratio of the nonmagnetic material is made higher in the storage layer region 17 than in the storage layer region 16. That is, the concentration ratio of the nonmagnetic material to the magnetic material is made higher in the storage layer region 17 than in the storage layer region 16.

Figure 9:
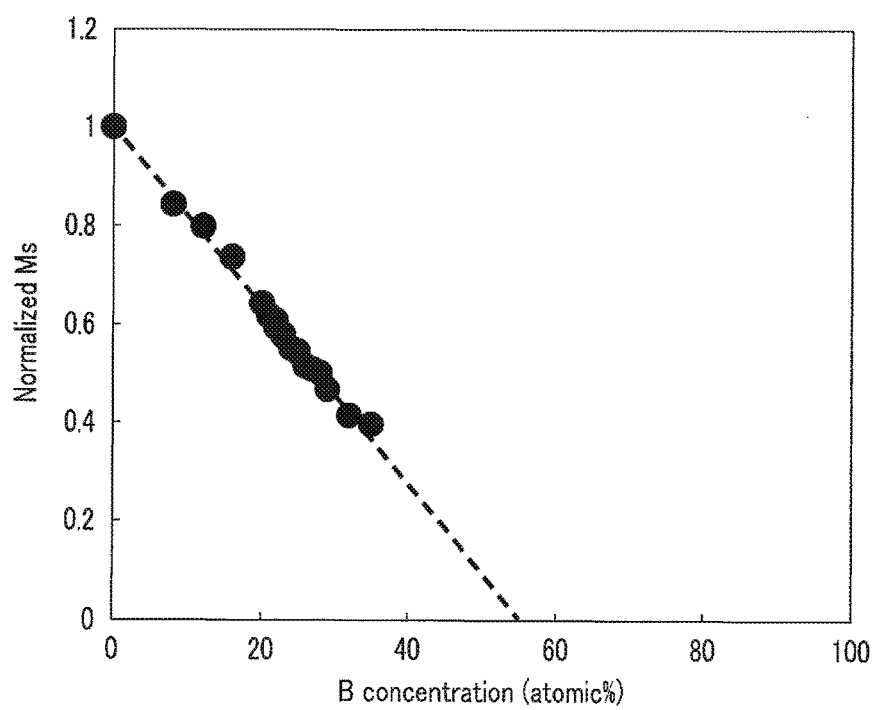
FIG. 9 is a graph illustrating a relation between a B concentration and Ms in CoFeB.

FIG. 9 is a graph illustrating a relation between the concentration of B in CoFeB and the Ms. As depicted in FIG. 9, the Ms decreases with increasing B concentration in CoFeB. Furthermore, the Ms tends to decrease monotonically in proportion to B, and the gradient of the corresponding graph is relatively gentle. This result indicates that a method for reducing the Ms at the storage layer edge region using the ion implantation of B is highly controllable. As described above, a decrease in Ms reduces the shape magnetic anisotropy energy (Ku-shape) provided by demagnetization fields resulting from the Ms.

The Ku-edge is substantially equal to the sum of Ku-shape and stress-induced magnetic anisotropy energy (Ku-stress). The Ku-stress is magnetic anisotropy energy resulting from a magneto-elastic (magneto-striction) effect applied to stress at the storage layer edge region. As a result of external stress on the protection layer 13 or the like, the stress applied to the storage layer edge region is different from the stress applied to the storage layer central region. Magneto-elastic effect occurs between the storage layer central region and the storage layer edge region. For example, if the storage layer has a magnetization characteristic with negative magneto-striction, the Ku-stress decreases when B is implanted to increase the compressive stress on the protection layer 13. In contrast, if the storage layer has a magnetization characteristic with positive magneto-striction, the Ku-stress increases. For example, a Co-rich CoFe alloy has a magnetization characteristic with positive magneto-striction, and an Fe-rich CoFe alloy has a magnetization characteristic with negative magneto-striction.

Figure 10:
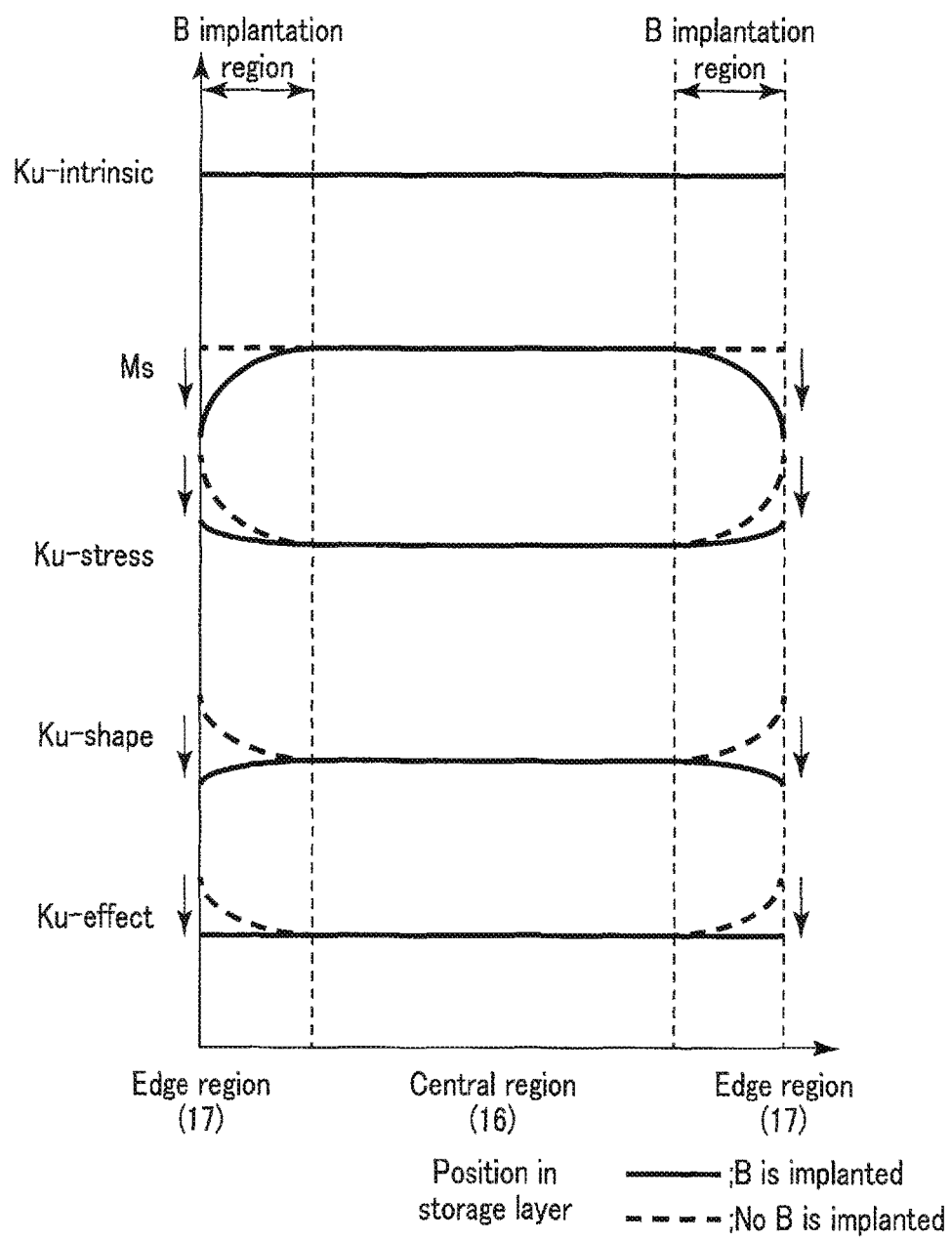
FIG. 10 is a graph illustrating saturation magnetization and magnetic anisotropy energy at a storage layer edge region and a storage layer central region in the semiconductor memory device according to the first embodiment.

FIG. 10 is a graph illustrating the saturation magnetization and the magnetic anisotropy energy at the storage layer edge region (storage layer region 17) and the storage layer central region (storage layer region 16). An example in FIG. 10 illustrates a case where the storage layer regions 16 and 17 have a magnetization characteristic with negative magneto-striction and where B implantation increases the compressive stress on the protection layer 13.

As depicted in FIG. 10, for example, implantation of B into the storage layer edge region reduces the Ms at the storage layer edge region. Consequently, the Ku-shape at the storage layer edge region decreases. Furthermore, since the B implantation increases the compressive stress on the protection layer 13, the Ku-stress at the storage layer edge region decreases. Therefore, the Ku-edge, which is substantially equal to the sum of the Ku-shape and the Ku-stress, decreases. Even with the implantation of B, the Ku-effect (Center) remains substantially unchanged (or slightly decreases). Therefore, optimizing the Ku-edge allows the Ku-effect in the storage layer to be made substantially uniform. When the storage layer has a magnetization characteristic with positive magneto-striction, the B implantation tends to increase the Ku-stress. However, the Ku-shape reduction effect resulting from a reduction in Ms is more significant. Therefore, also in this case, the Ku-edge tends to decrease.

Furthermore, the Ms reduction effect at the storage layer edge region resulting from the ion implantation of B or the like includes an effect associated with an increase the composition of the ion implanted element and an effect associated with the crystal structure. This is because, in the magnetic material containing Co, Fe, or Ni, the crystalline material tends to have high saturation magnetization Ms, whereas the amorphous structure tends to have low saturation magnetization Ms. For the ion implantation of B or the like, the storage layer region 16 has a higher crystallinity that the storage layer region 17 and thus exhibits a high crystalline property. That is, the storage layer region 17 is relatively nearly amorphous.

In this regard, any of neon (Ne), argon (Ar), krypton (Kr), and xenon (Xe), which are inert gases, may be used as another implanted element. In this case, the reduction effect on the saturation magnetization Ms is produced by making the storage layer region 17 amorphous. In this case, the MTJ element 1 includes the storage layer region 16 mainly formed of the crystalline material and the storage layer region 17 mainly formed of the amorphous material, leading to a difference in saturation magnetization Ms attributed to a difference in crystal structure.

Reducing the Ms at the storage layer edge region in this manner allows the uniformity of the Ku-effect to be improved. As a result, during a writing operation, the magnetic domain walls move smoothly in the storage layer, enabling a reduction in the dwell time of the magnetic domain walls. Therefore, the WER can be reduced to enhance the reliability of the semiconductor memory device.

2. Second Embodiment

Now, a second embodiment will be described. In the second embodiment, a material containing B is used for the protection layer 13, and B is diffused from the protection layer 13 to the storage layer edge region by thermal treatment. Only differences from the first embodiment will be described.

2.1 Sectional Configuration of the MTJ Element

First, a sectional configuration of the MTJ element 1 will be described. The sectional configuration of the MTJ element 1 in the present embodiment is the same as the sectional configuration of the MTJ element 1 in the first embodiment depicted in FIG. 1.

A film containing B is used for the protection layer 13 in the present embodiment. For example, the protection layer 13 may contain boron nitride (BN), boron oxide ($B_2O_3$), boron (B), silicon boron nitride (SiBN), silicon boron oxide (SiBO), and a laminate film of any of these elements. Furthermore, the B concentration in the protection layer 13 is preferably 20 at % due to the need to diffuse B to the storage layer edge region. Moreover, the protection layer 13 may be a laminate film with a film formed of, for example, SiN and containing no B so as to prevent diffusion of B to the insulating layer 24 and surface oxidation.

The element diffused from the protection layer 13 to the storage layer edge region is not limited to B. For example, one of C, N, or P may be used. In this case, the protection layer 13 contains one of C, N, or P. When a light element such as B diffuses from the protection layer 13 containing B to the storage layer edge region, a diffusion width for B or the like, that is, the width of the storage layer region 17, may be 1 nm.

Moreover, other elements contained in the protection layer 13 except O and N may be diffused. In this case, for the protection layer 13, a film may be used which is insufficiently oxidized, nitrided, or oxynitrided and which is likely to react with the storage layer. More specifically, for the protection layer 13, SiN, $SiO_2$, or SiON, which is rich in Si compared to a stoichiometric ratio, may be used. For the protection layer 13, AlN or $Al_2O_3$, which is rich in Al compared to the stoichiometric ratio, may be used. For the protection layer 13, MgO, which is rich in Mg compared to the stoichiometric ratio, may be used. In this case, thermal treatment diffuses Si, Al, or Mg in the protection layer 13 to the storage layer edge region to reduce the Ms at the storage layer edge region. Alternatively, the protection layer 13 may contain Ca, Cr, Hf, Ta, Zr, or a rare earth element such as Sc, and the element may be diffused to the storage layer edge region.

When Si is diffused to the storage layer edge region, a compound (silicide) of Si and Co, Fe, or Ni, which is a magnetic material, may be formed in the storage layer region 17.

When Al is diffused to the storage layer edge region, the Ms at the storage layer edge region (the storage layer region 17) can be efficiently reduced because Al is soluble in an ally which consists of at least Co, Fe, or Ni at any concentrations.

Mg, Ca, or Sc is partially soluble in an alloy which consists of at least Co, Fe, or Ni.

For the protection layer 13, for example, $Cr_2O_3$ or CrN may be used. Cr is soluble in an alloy which consists of at least Co, Fe, or Ni at any concentrations, enabling an efficient reduction in the Ms at the storage layer region 17. However, Co, Fe, or Ni is antiferromagnetically coupled to Cr, thus fluctuating the Ku-intrinsic in the storage layer.

Hf, Ta, Zr, or a rate earth element such as Sc diffuses in the storage layer formed of Co, F, or Ni in a substitutional manner. Thus, a diffusion speed is relatively low, and the diffusion width in the storage layer (the width of the storage layer region 17) can be easily controlled.

Moreover, after Si, Al, Mg, or the like in the protection layer 13 is diffused to the storage layer edge region by thermal treatment, the protection layer 13 may be oxidized, nitrided, or oxynitrided.

Furthermore, as the method for allowing the element in the protection layer 13 to infiltrate into the storage layer edge region, the ion implantation through the protection layer 13 is effective in addition to the diffusion based on the thermal treatment, as described above. In this case, one of neon (Ne), argon (Ar), krypton (Kr), and xenon (Xe), which are inert gases, is used as another implanted element. However, instead of the effect of the ion implanted element, a knocking effect (implantation effect) exerted at the time of ion implantation or irradiation is utilized to implant the elements in the protection layer 13 into the storage layer to implant the elements in the protection layer 13 into the storage layer region. Consequently, a method for reducing the saturation magnetization Ms in the storage layer region 17 may be developed.

2.2 Manufacturing Method for the MTJ Element

Figure 11:
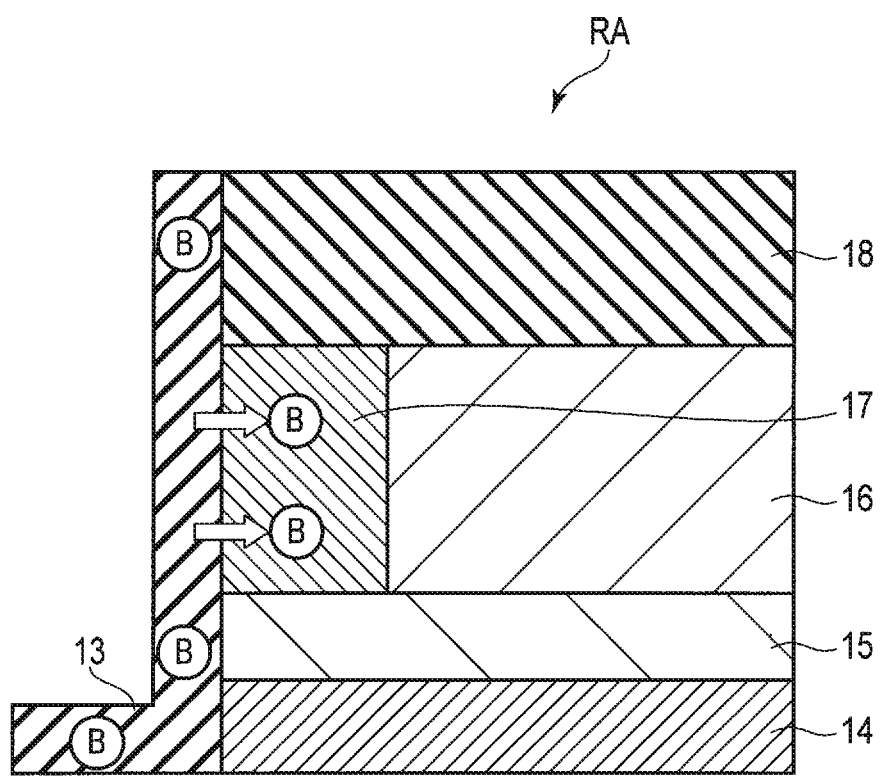
FIG. 11 is a sectional view of the area RA illustrating a process of manufacturing an MTJ element provided in a semiconductor memory device according to a second embodiment.

Now, a manufacturing method for the MTJ element 1 will be described. FIG. 11 is a sectional view of the area RA illustrating a manufacturing process for the MTJ element 1 provided in the semiconductor memory device according to the second embodiment.

A part of the manufacturing method before formation of the protection layer 13 is the same as the corresponding part of the manufacturing method in the first embodiment. As depicted in FIG. 11, in the present embodiment, thermal treatment is executed after the protection layer 13 containing B is formed. More specifically, the thermal treatment is executed immediately after formation of the protection layer 13, for example, with a film thickness (the film thickness at the storage layer side wall portion of the MTJ element 1) of 3 to 30 nm. The formation of the protection layer 13 and the thermal treatment are preferably executed in a total vacuum process in order to allow the process to be appropriately controlled and to restrain the surface of the protection layer 13 from being oxidized. Consequently, B in the protection layer 13 diffuses to form the storage layer region 17. The thermal treatment also allows B to diffuse to the edge regions of the other layers and to the neighborhood of the surface of the insulating layer 11. However, this does not seriously affect the magnetization characteristics of the storage layer regions 16 and 17, and thus, the corresponding illustration and description are omitted.

For example, if SiN, $SiO_2$, or SiON, which is rich in Si, is used for the protection layer 13, the protection layer 13 may be nitrided, oxidized, or oxynitrided again after the thermal treatment. In this case, plasma or radical of oxygen or nitrogen may be radiated or annealing (250 to 450 degrees) may be performed in an oxygen atmosphere.

Subsequently, as is the case with the first embodiment, the insulating layer 24 is formed, and the TEG plug 25 is formed. After formation of the insulating layer 24, the thermal treatment may be executed to diffuse B.

2.3 Effects Relating to the Present Embodiment

A configuration according to the present embodiment produces effects similar to the effects of the first embodiment.

Moreover, the configuration according to the present embodiment allows B to diffuse based on conditions for the thermal treatment following the formation of the protection layer 13. Thus, the diffusion of B to the storage layer edge region can be easily controlled. Therefore, the Ms at the storage layer region 17 can be more effectively reduced.

3. Third Embodiment

Now, a third embodiment will be described. In the third embodiment, a case will be described where an etching residue containing B is deposited on the side walls of the MTJ element 1 so that B contained in the etching residue is diffused to the storage layer edge region. Only differences from the first and second embodiments will be described.

3.1 Sectional Configuration of the MTJ Element

Figure 12:
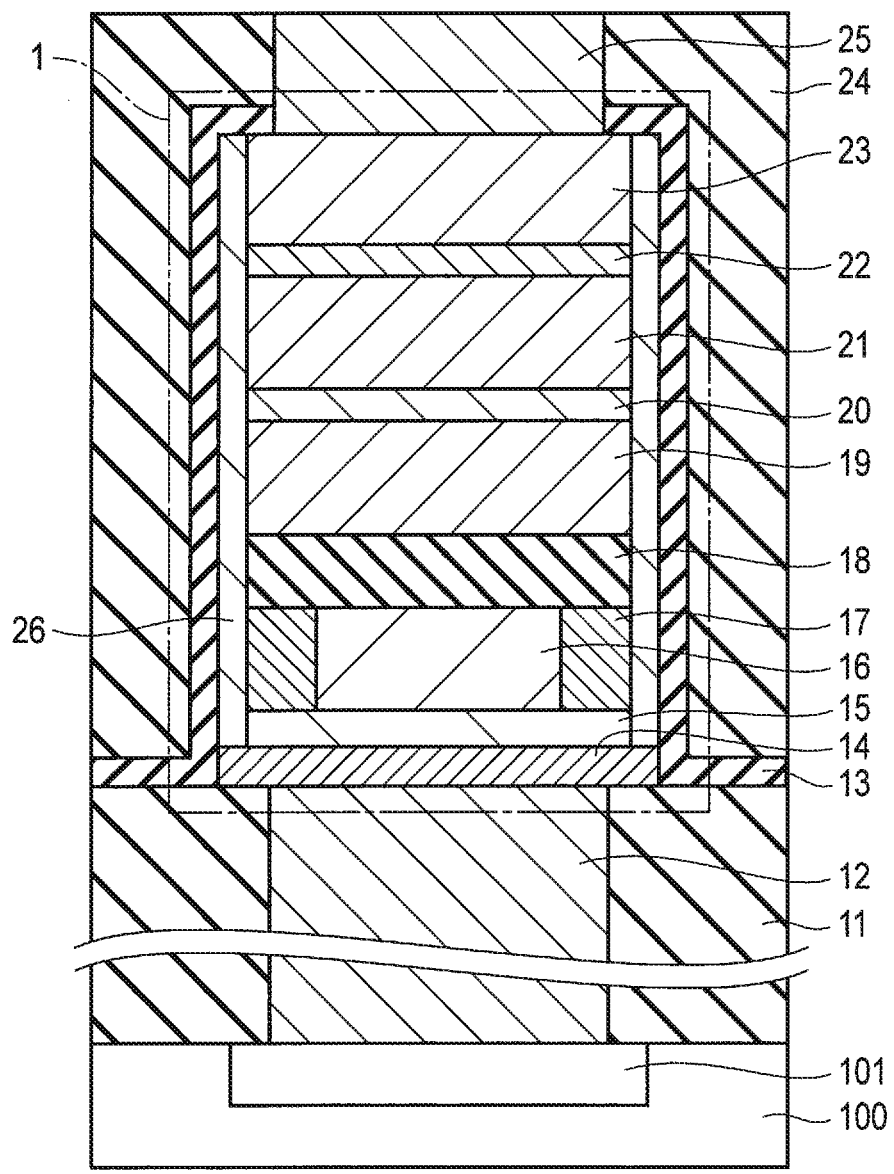
FIG. 12 is a sectional view of an MTJ element provided in a semiconductor memory device according to a third embodiment.

First, a sectional configuration of the MTJ element 1 will be described. FIG. 12 is a sectional view of the MTJ element 1 provided in a semiconductor memory device according to the third embodiment.

As depicted in FIG. 12, the MTJ element 1 in this figure is different from the MTJ element 1 in FIG. 1 for the first embodiment in that a deposition layer 26 is provided between the side surface of the MTJ element 1 and the side surface of the protection layer 13. The deposition layer 26 is an etching residue (by-product) resulting from etching of the buffer layer 14. For example, when the buffer layer 14 is physically etched by IBE, the deposition layer 26 has substantially the same composition as that of the buffer layer 14. Therefore, when a material containing B is used for the buffer layer 14, the deposition layer 26 is also a layer containing B.

For the buffer layer 14 in the present embodiment, a film containing B is used. For example, the following may be used: calcium boride or alloy (CaB), scandium boride or alloy (ScB), magnesium boride or alloy (MgB), silicon boride or alloy (SiB), aluminum boride or alloy (AlB), tantalum boride or alloy (TaB), zirconium boride or alloy (ZrB), niobium boride or alloy (NbB), hafnium boride or alloy (HfB), chromium boride or alloy (CrB), a laminate film of any of these materials, or a ternary compound containing any of these materials. The B concentration of the buffer layer 14 is preferably 20 at % because B needs to be diffused from the deposition layer 26 to the storage layer edge region.

The element diffused from the deposition layer 26 to the storage layer edge region is not limited to B. For example, one of C, N, or P may be used. In this case, the buffer layer 14 contains one of C, N, or P.

Moreover, like the protection layer 13 in the second embodiment, the buffer layer 14 may contain Si, Al, Mg, Ca, Cr, Hf, Ta, Zr, or a rare earth element such as Sc. In this case, Si, Al, Mg, Ca, Cr, Hf, Ta, Zr, or the rare earth element such as Sc is diffused from the deposition layer 26 to the storage layer edge region.

The buffer layer 14 may have an amorphous structure, and an amorphous layer is preferable in that the film surface is kept smooth. The buffer layer 14 may also contain a compound such as a boride with boron (B), a carbide with carbon (C), or a phosphor with phosphorous (P).

3.2 Manufacturing Method for the MTJ Element

Figure 16:
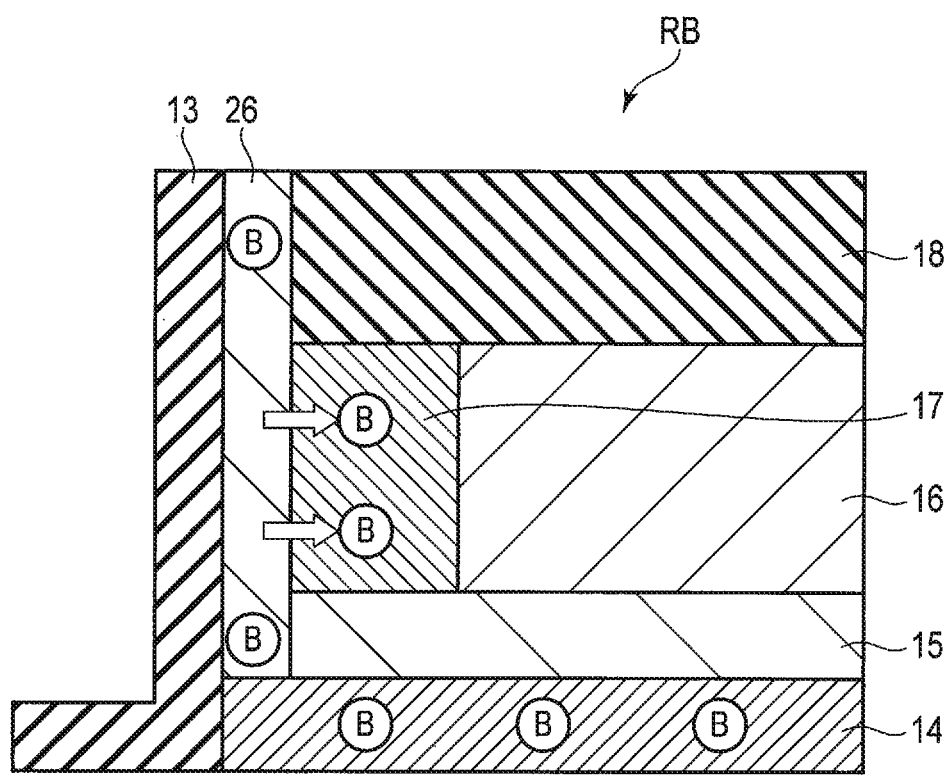
FIG. 16 is a sectional view of an area RB illustrating the process of manufacturing the MTJ element provided in the semiconductor memory device according to the third embodiment.

Now, a manufacturing method for the MTJ element 1 will be described. FIGS. 13 to 15 are sectional views of the MTJ element 1 illustrating a manufacturing process for the MTJ element 1 provided in the semiconductor memory device according to the third embodiment. FIG. 16 is a sectional view of an area RB illustrating the manufacturing process for the MTJ element 1 provided in the semiconductor memory device according to the third embodiment. The area RB is an area of the MTJ element 1 which is located near the storage layer edge region and which includes the storage layer edge region.

A part of the procedure of the process before etching of the hard mask layer 23 is the same as the corresponding part of the procedure in the first embodiment illustrated in FIG. 4.

As depicted in FIG. 13, for example, when IBE is used, a part of the MTJ element 1 from the cap layer 22 to the neighborhood of the tunnel barrier layer 18 is etched under a first condition that the incident angle (the angle with respect to the normal direction of the semiconductor substrate 100) of ion beams is relatively large (for example, 45° or larger) At this time, mass analysis is executed on exhaust gas during etching using a quadruple mass spectrometer to enable a check of whether, for example, Mg in the tunnel barrier layer 18 has been etched. Since, under the first condition, the incident angle of ion beams is relatively large, side surface of the layers from the cap layer 22 to the tunnel barrier layer 18 are likely to be etched, and a shape of the MTJ element 1 from the cap layer 22 to the tunnel barrier layer 18 is likely to be tapered. Furthermore, side etching makes an etching residue unlikely to remain on the side surface.

As depicted in FIG. 14, for example, the layers down to the buffer layer 14 are processed under a second condition that the incident angle of ion beams is relatively small (for example, 30° or smaller). The side surface of the MTJ element 1 from the cap layer 22 to the tunnel barrier layer 18 has a substantially perpendicular shape (substantially perpendicular to the semiconductor substrate 100) because the tapered portions are etched. The tapered shape formed under the first condition is transferred to the layers from the storage layer 16 to the buffer layer 14, but as the etching progresses, the side surfaces are etched to approach the perpendicular shape. Therefore, etching of the side surface is controlled to enable etching residues of the layers from the cap layer 22 to the underlayer 15 to be prevented from remaining on the side surface of the MTJ element 1. Then, when the lowermost buffer layer 14 is etched, an etching residue of the buffer layer 14 attaches to the side surface of the MTJ element 1 to form the deposition layer 26. Additionally, the film thickness of the deposition layer 26 may vary between an upper side and a lower side of each side surface of the MTJ element 1.

As depicted in FIG. 15, the protection layer 13 is formed so as to cover the top surface and the side surface (deposition layer 26) of the MTJ element 1 and the top surface of the insulating layer 11.

As depicted in FIG. 16, after the formation of the protection layer 13, thermal treatment is executed as is the case with the second embodiment to diffuse B contained in the deposition layer 26 to the storage layer edge region to form the storage layer region 17. In this case, a part of the process from processing of the MTJ element 1 to the thermal treatment is preferably executed in a total vacuum process. The thermal treatment also allows B to diffuse to the edges of the other layers and to the neighborhood of the surface of the insulating layer 11. However, this does not seriously affect the magnetization characteristics of the storage layer regions 16 and 17, and thus, the corresponding illustration and description are omitted.

Subsequently, as is the case with the first embodiment, the insulating layer 24 is formed, and the TEG plug 25 is formed.

The thermal treatment may be executed before the formation of the protection layer 13 or after the formation of the insulating layer 24. For example, if the thermal treatment is executed before the formation of the protection layer 13, then after the thermal treatment, the deposition layer 26 may be oxidized, nitrided, or oxynitrided.

3.3 Effects Relating to the Present Embodiment

A configuration according to the present embodiment produces effects similar to the effects of the first and second embodiments.

Moreover, in the configuration according to the present embodiment, the deposition layer 26 is formed by the etching of the buffer layer 14. This eliminates the need to newly provide a layer through which B is supplied to the MTJ element 1.

4. Fourth Embodiment

Now, a fourth embodiment will be described. In the fourth embodiment, the MRAM will be described which includes the MTJ element 1 described in the first to third embodiments.

4.1 General Configuration of the Semiconductor Memory Device

First, a general configuration of a semiconductor memory device according to the present embodiment will be described.

FIG. 17 is a block diagram of the semiconductor memory device according to the fourth embodiment.

As depicted in FIG. 17, the semiconductor memory device according to the fourth embodiment comprises a memory cell array MCA, column control circuits 3A and 3B, a row control circuit 4, write circuits 5A and 5B, and a read circuit 6A.

The memory cell array MCA is configured by arranging a plurality of memory cells MC in a matrix. In the memory cell array MCA, a plurality of word lines WL0 to WLi−1 (i: a natural number of 1 or larger), a plurality of bit lines BL0 to BLj−1 (j: a natural number of 1 or larger), and a plurality of source lines SL0 to SLj−1 are arranged. When not distinguished from one another, the word lines WL0 to WLi−1 are simply referred to as the word lines WL. Furthermore, when not distinguished from one another, the bit lines BL0 to BLj−1 are simply referred to as the bit lines BL. Additionally, when not distinguished from one another, the source lines SL0 to SLj−1 are simply referred to as the source lines SL.

An extension direction of the bit lines BL and the source lines SL is designated as a column direction (D1 direction). An extension direction of the word lines which is substantially orthogonal to the column direction is designated as a row direction (D2 direction). In FIG. 1, the bit lines BL, the source lines SL extend in the column direction, and the word lines WL extend in the row direction. However, the present embodiment is not limited to this configuration. The configuration can be changed as needed.

The memory cells MC are coupled to the bit lines BL, the source lines SL, and the word lines WL. A plurality of memory cells MC arranged in the column direction is coupled to the common bit line BL and to the common source line SL. A plurality of memory cells MC arranged in the row direction is coupled to the common word line WL.

Each of the memory cells MC comprises the MTJ element 1 and a select transistor 2. The select transistor 2 comprises, for example, an N channel MOSFET (metal oxide semiconductor field effect transistor).

One end (for example, the TEG plug 25) of the MTJ element 1 is coupled to the corresponding bit line BL. The other end (for example, the BEC plug 12) of the MTJ element 1 is coupled to a drain (source) of the select transistor 2. A gate of the select transistor 2 is coupled to the word line WL, and the source (drain) of the select transistor 2 is coupled to the corresponding source line SL.

One end of each of the word lines WL is coupled to the row control circuit 4. The row control circuit 4 controls selection/non-selection of each of the word lines WL based on an external address signal.

The column control circuits 3A and 3B are coupled to one end and the other end, respectively, of each of the bit lines BL and the source lines SL. The column control circuits 3A and 3B control selection/non-selection of each of the bit lines BL and the source lines SL based on an external address signal.

The write circuits 5A and 5B are coupled to the one end and the other end, respectively, of each of the bit lines BL and the source lines SL via the column control circuits 3A and 3B, respectively. Each of the write circuits 5A and 5B comprises a source circuit such as a current source or a voltage source configured to generate a writing current, and a sink circuit configured to absorb the writing current.

During data writing, the write circuits 5A and 5B supply the writing current to an externally selected memory cell (hereinafter referred to as a select cell).

When data is written to the MTJ element 1, the write circuits 5A and 5B pass, in accordance with data written to the select cell, the writing current through the MTJ element 1 in the memory cell MC in both directions. That is, in accordance with the data written to the MTJ element 1, the writing current from the bit line BL toward the source line SL or the writing current from the source line SL toward the bit line BL is output from the write circuits 5A and 5B.

The read circuit 6A is coupled to the one end and the other end of each of the bit lines BL and the source lines SL via the column control circuits 3A and 3B. The read circuit 6A includes a voltage source or a current source which generates a reading current, a sense amplifier that senses and amplifies a reading signal, and a latch circuit that temporarily holds data. When data is read from the MTJ element 1, the read circuit 6A supplies the reading current to the select cell. The current value of the reading current is set smaller than the current value (magnetization reversal threshold) of the writing current so as not to allow the reading current to reverse the magnetization in the storage layer regions 16 and 17.

The current value or potential of a read node varies according to the magnitude of a resistance value for the MTJ element 1 to which the reading current is supplied. The data stored in the MTJ element 1 is determined based on the amount of fluctuation (reading signal, reading output) corresponding to the magnitude of the resistance value.

In the example illustrated in FIG. 17, the read circuit 6A is provided on the one end side in the column direction. However, two read circuits may be provided at the one end and the other end, respectively, in the column direction.

For example, in the same chip as that of the memory cell array MCA, a circuit (hereinafter referred to as a peripheral circuit) different from the column control circuits 3A and 3B, the row control circuit 4, the write circuits 5A and 5B, and the read circuit 6A may be provided. For example, a buffer circuit, a state machine (control circuit), or an ECC (Error Checking and Correcting) circuit may be provided in the chip as a peripheral circuit.

4.2 Effects Relating to the Present Embodiment

The MTJ element 1 described in the first to third embodiments can be applied to the semiconductor memory device in the present embodiment.

5. Modifications and the Like

The embodiments are not limited to the above-described forms but may be variously modified.

Moreover, the terms "connect" and "couple" in the above-described embodiments include indirect coupling of components with any other component, for example, a transistor or a resistor, interposed between the components.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a magnetoresistive element provided over a semiconductor substrate and including a first magnetic layer, a nonmagnetic layer, and a second magnetic layer, the magnetoresistive element being capable of storing data according to a direction of magnetization in the first magnetic layer; and
an insulating layer which covers a side surface of the magnetoresistive element,
wherein:
the first magnetic layer includes a first region and a second region provided between the insulating layer and the first region,
the first and second regions have magnetization,
each of the first and second regions includes a magnetic material and a nonmagnetic material, and
a concentration ratio of the nonmagnetic material to the magnetic material is higher in the second region than in the first region.

2. The device according to claim 1, wherein
the magnetic materials in the first and second regions include at least one of cobalt (Co), iron (Fe), and nickel (Ni).

3. The device according to claim 1, wherein
the nonmagnetic materials in the first and second regions contain boron (B), and
a concentration ratio of the boron to the magnetic material is higher in the second region than in the first region.

4. The device according to claim 1, wherein
the insulating layer contains at least one of aluminum (Al), silicon (Si), and magnesium (Mg).

5. The device according to claim 1, wherein
the nonmagnetic material in the second region includes at least one of boron (B), nitrogen (N), phosphorous (P), and carbon (C).

6. The device according to claim 1, wherein
the first magnetic layer, the nonmagnetic layer, and the second magnetic layer are laminated in order above the semiconductor substrate.

7. The device according to claim 1, wherein
the second magnetic layer, the nonmagnetic layer, and the first magnetic layer are laminated in order above the semiconductor substrate.

8. The device according to claim 1, wherein
saturation magnetization is lower in the second region than in the first region.

9. The device according to claim 1, wherein
the nonmagnetic material in the second region contains boron (B), and a concentration ratio of the boron to the magnetic material in the second region decreases from an interface between the second region and the insulating layer toward an interface between the second region and the first region.

10. The device according to claim 1, wherein
the insulating layer contains at least one of boron nitride (BN), boron oxide ($B_2O_3$), boron (B), silicon boron nitride (SiBN), and silicon boron oxide (SiBO).

11. The device according to claim 1, wherein
the nonmagnetic material in the second region and the insulating layer contain at least one of boron (B), carbon (C), nitrogen (N), phosphorous (P), silicon (Si), aluminum (Al), magnesium (Mg), calcium (Ca), chromium (Cr), hafnium (Hf), tantalum (Ta), zirconium (Zr), and scandium (Sc).

12. The device according to claim 1, wherein:
the magnetoresistive element further includes:
- a first conductive layer provided below the first magnetic layer; and
- a first layer provided between the insulating layer and the second region, and the first conductive layer and the first layer contain at least one of calcium boride (CaB), scandium boride (ScB), magnesium boride (MgB), silicon boride (SiB), aluminum boride (AlB), tantalum boride (TaB), zirconium boride (ZrB), niobium boride (NbB), hafnium boride (HfB), and chromium boride (CrB).

13. The device according to claim 1, wherein:
the magnetoresistive element further includes:
- a first conductive layer provided below the first magnetic layer; and
- a first layer provided between the insulating layer and the second region, and the first conductive layer and the first layer contain a same element.

14. The device according to claim 1, wherein
the second magnetic layer contains at least one of cobalt platinum (CoPt), cobalt nickel (CoNi), cobalt palladium (CoPd), a multilayer film of Co and Pt, and a multilayer film of Co and Pd.

15. The device according to claim 1, wherein
the nonmagnetic layer contains at least one of magnesium oxide (MgO) and aluminum oxide ($Al_2O_3$).

16. The device according to claim 6, wherein:
the magnetoresistive element further includes:
- a spacer layer provided on the second magnetic layer; and
- a third magnetic layer provided on the spacer layer, and
- a direction of magnetization in the second magnetic layer is opposite to a direction of magnetization in the third magnetic layer.

17. The device according to claim 1, wherein
the nonmagnetic materials in the first and second regions contain at least one of boron (B), carbon (C), nitride (N), phosphorous (P), silicon (Si), aluminum (Al), magnesium (Mg), calcium (Ca), chromium (Cr), hafnium (Hf), tantalum (Ta), zirconium (Zr), and scandium (Sc).

18. The device according to claim 1, wherein
the insulating layer contains at least one of silicon nitride (SiN), aluminum nitride (AlN), aluminum oxide ($Al_2O_3$), silicon carbide (SiC), silicon oxynitride (SiON), silicon carbonitride (SiCN), magnesium oxide (MgO), and DLC (diamond like carbon).

19. The device according to claim 1, wherein
the magnetic materials in the first and second regions contain at least one of cobalt iron boron (CoFeB) and iron boron (FeB).

* * * * *